United States Patent [19]

Grimes

[11] Patent Number: 5,122,688

[45] Date of Patent: Jun. 16, 1992

[54] TRINARY CHECK TRIT GENERATOR, LATCH, COMPARATOR AND MULTIPLEXER

[75] Inventor: Dwight W. Grimes, Boca Raton, Fla.

[73] Assignee: International Business Machines Corporation, Armonk, N.Y.

[21] Appl. No.: 518,617

[22] Filed: May 3, 1990

Related U.S. Application Data

[62] Division of Ser. No. 225,976, Jul. 29, 1988, Pat. No. 4,961,192.

[51] Int. Cl.$^5$ .......................................... H03K 19/20
[52] U.S. Cl. ................................... 307/473; 307/243; 307/360; 307/443; 365/168; 371/56
[58] Field of Search ................ 365/168; 371/56, 37.1; 307/443, 473, 360, 362, 494, 496, 272.2, 243

[56] References Cited

U.S. PATENT DOCUMENTS

| | | | |
|---|---|---|---|
| 3,866,147 | 2/1975 | DeCouvreur et al. | 371/56 X |
| 4,244,052 | 1/1981 | Hemsworth | 371/56 X |
| 4,518,875 | 5/1985 | Aytac | 307/473 |
| 4,631,428 | 12/1986 | Grimes | 307/473 X |
| 4,661,801 | 4/1987 | Chen et al. | 371/56 X |
| 4,808,854 | 2/1989 | Reinagel | 307/473 |
| 4,910,750 | 3/1990 | Fisher | 371/56 X |
| 4,961,192 | 10/1990 | Grimes | 371/56 X |

FOREIGN PATENT DOCUMENTS

| | | | |
|---|---|---|---|
| 2030763 | 5/1978 | Fed. Rep. of Germany | 371/56 |
| 0151395 | 8/1984 | Japan | 365/168 |
| 82/02977 | 9/1982 | World Int. Prop. O. | 365/168 |

OTHER PUBLICATIONS

Grimes, "Ternary CMOL Logic Device", *IBM T. D. B.*, vol. 17, No. 4, Sep. 1974, pp. 1145-1146.
"Trinary Logic Circuits", *IBM T. D. B.*, vol. 31, No. 3, Aug. 1988, pp. 48-56.
Moley et al., "Auto-Reset Ternary Latch", *IBM T. D. B.*, vol. 14, No. 2, Jul. 1971, pp. 630-631.

*Primary Examiner*—David Hudspeth
*Attorney, Agent, or Firm*—James A. Kunkle

[57] ABSTRACT

A method and apparatus for performing data error detection and correction is disclosed for multi-level logic and in particular, three-level trinary logic of levels 0, 1, 2. A source of trinary data supplies individual pieces of data (trits of 0, or 1, or 2) in multiple trit groups (trytes) to two separate check trit generators which generate unique check trits for each tryte input. The check trits from the two check trit generators are compared to form syndrome trits which are used to control an error detection function. For single errors per tryte a data correction function is activated to increment or decrement the incorrect data through a multiplexer. Multiple errors or no error conditions are indicated, but do not gate the data correction function.

22 Claims, 27 Drawing Sheets

TRINARY CHECK TRIT GENERATOR

FIG. I.
TRINARY DATA ERROR DETECTION AND CORRECTION SYSTEM

DATA CORRECTOR

TRINARY CHECK TRIT GENERATOR

CHECK TRIT GENERATOR TREE

TRINARY DATA SOURCE

CHECK TRIT GENERATOR UNIT 100

CTGU-2 REGISTER

CTGU-1 REGISTER

CHECK TRIT COMPARATOR UNIT

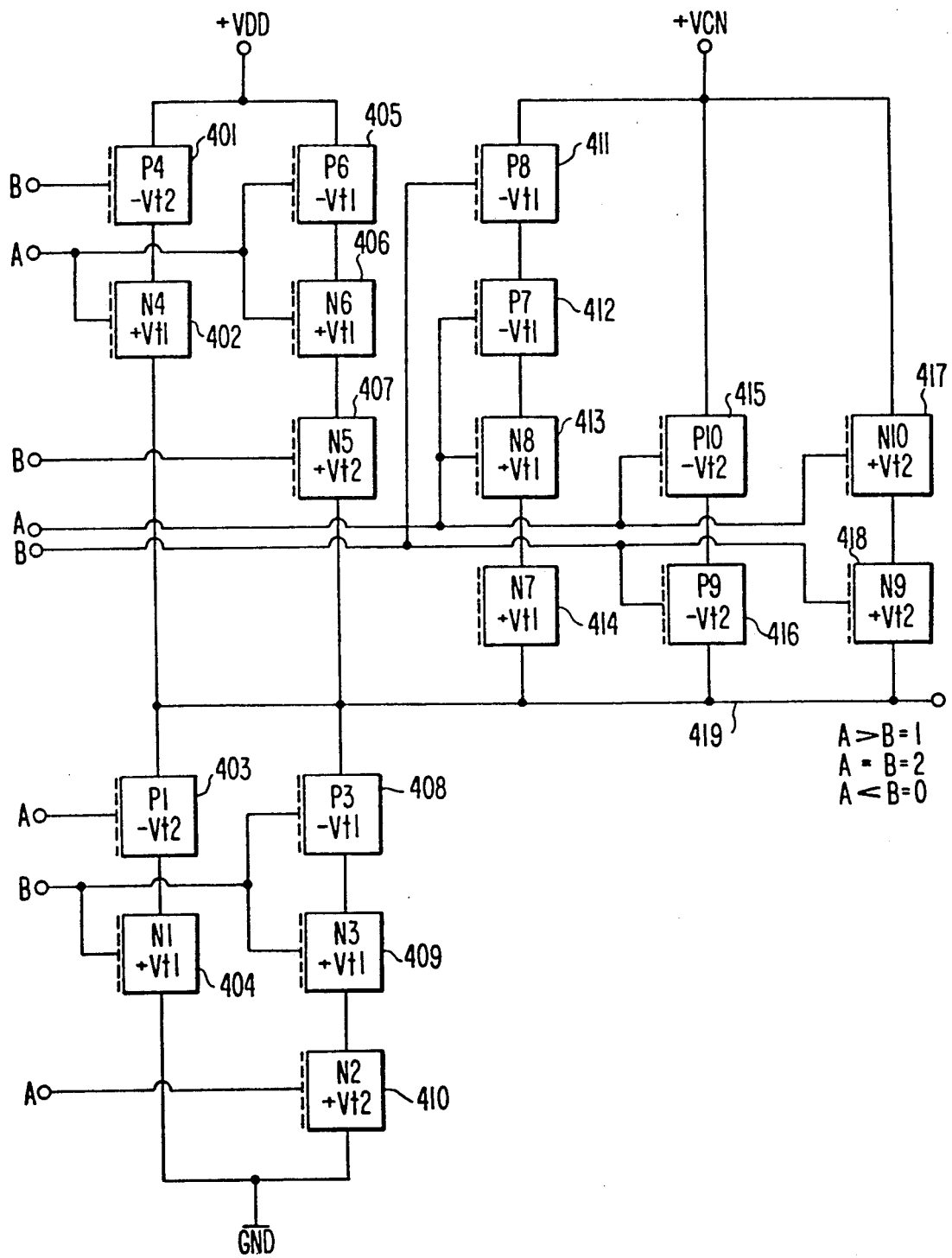

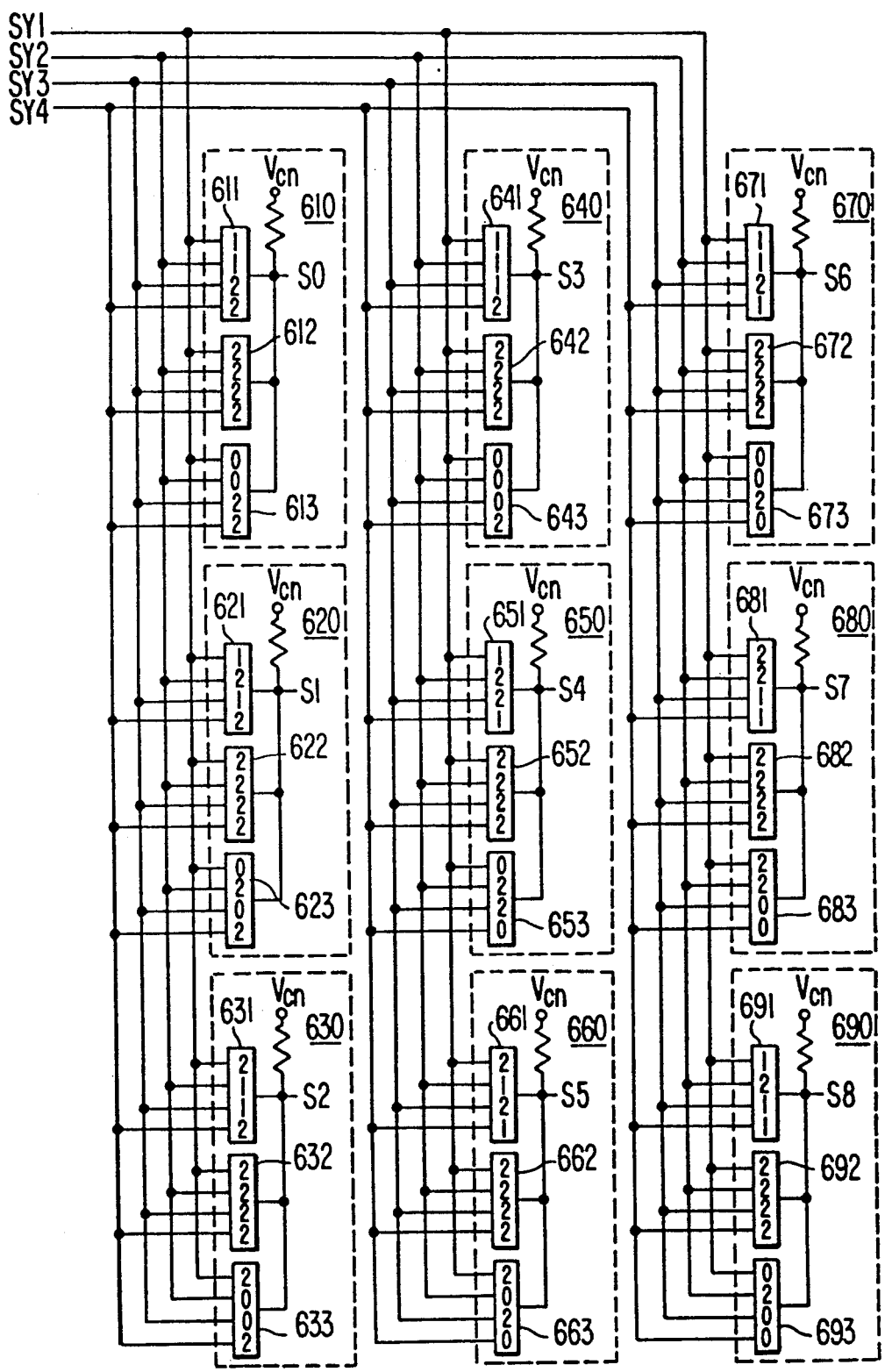

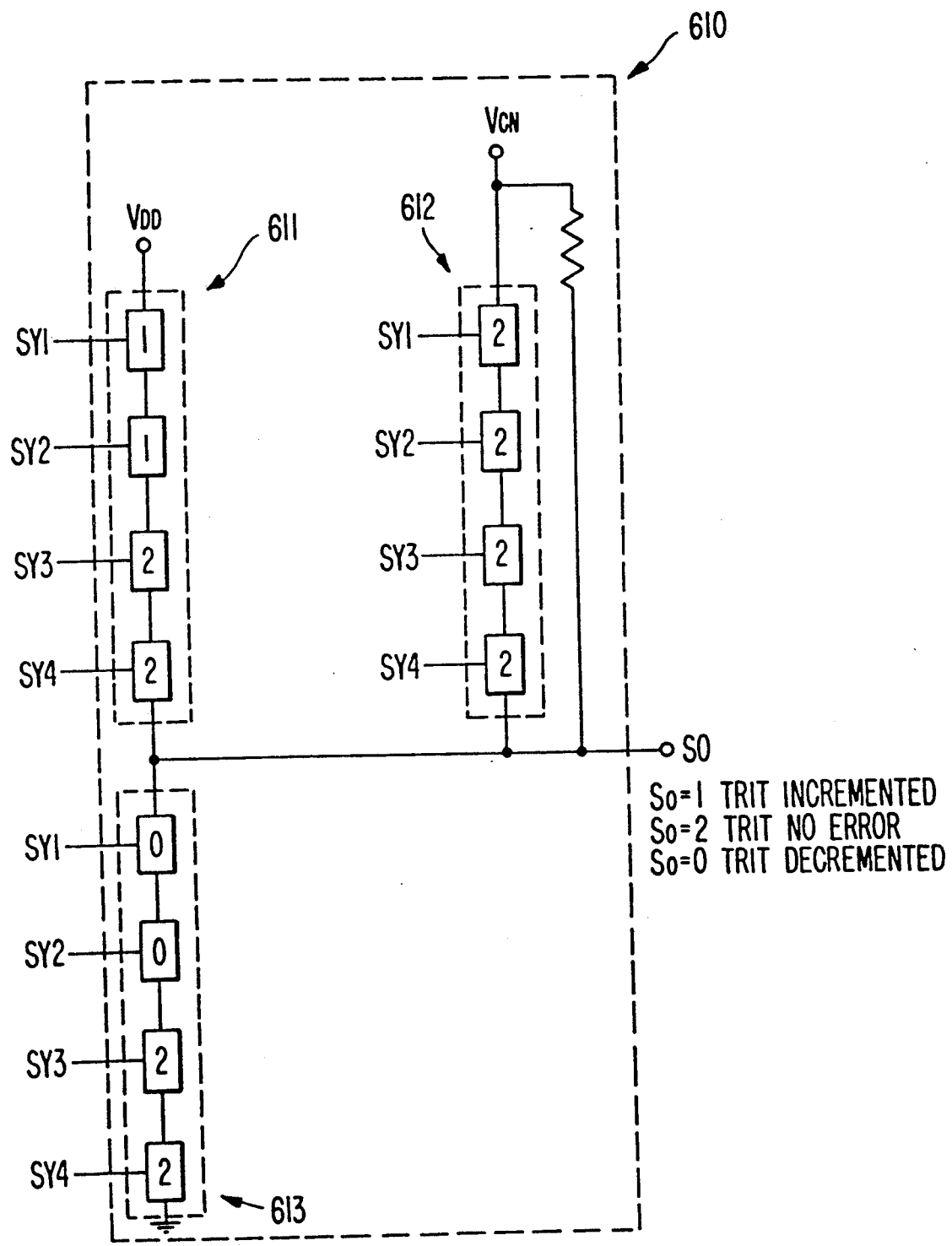
FIG. IIA.
SINGLE ERROR DETECTOR
So=1 TRIT INCREMENTED
So=2 TRIT NO ERROR
So=0 TRIT DECREMENTED

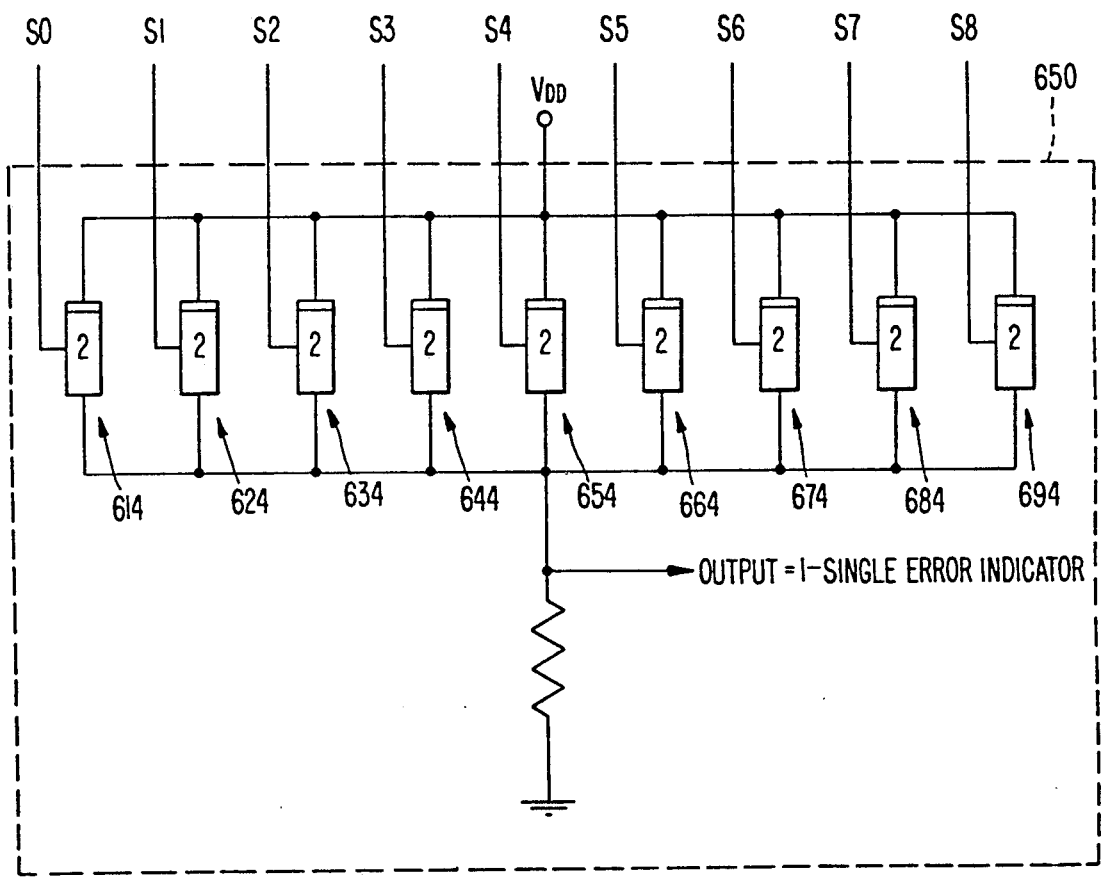

NO-ERROR DETECTOR 800

MULTIPLE ERROR DETECTOR 700

INCREMENTOR UNIT

TRINARY INCREMENTOR

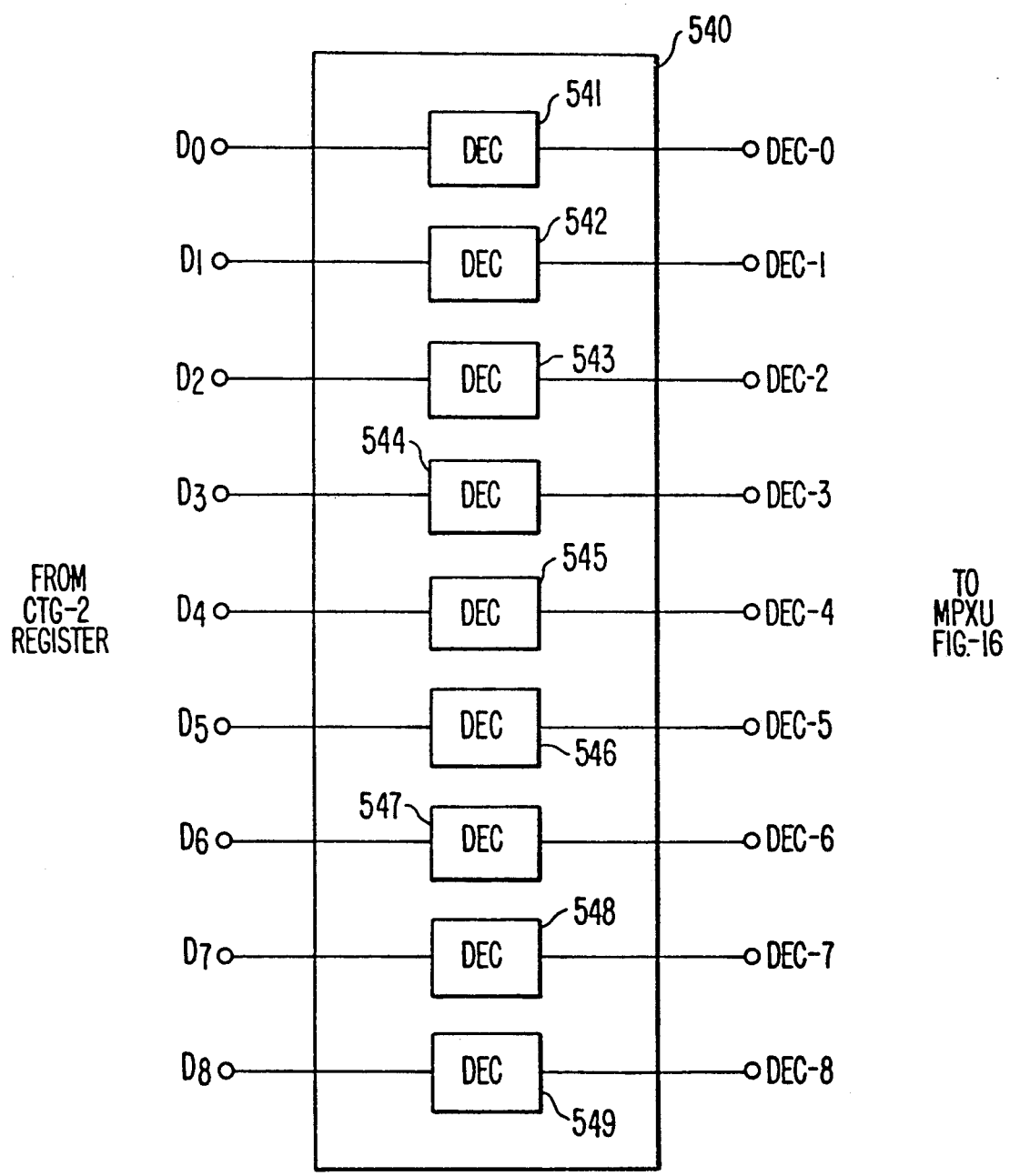

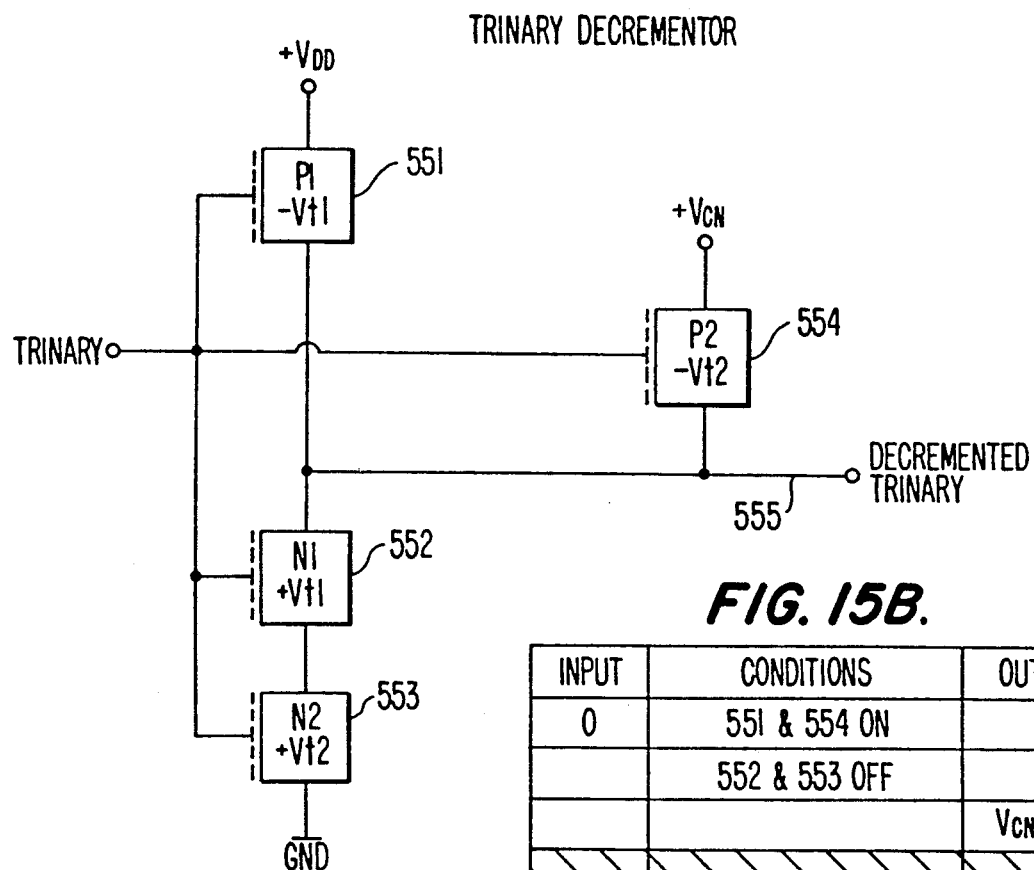

MULTIPLEXOR UNIT

TRINARY MULTIPLEXOR

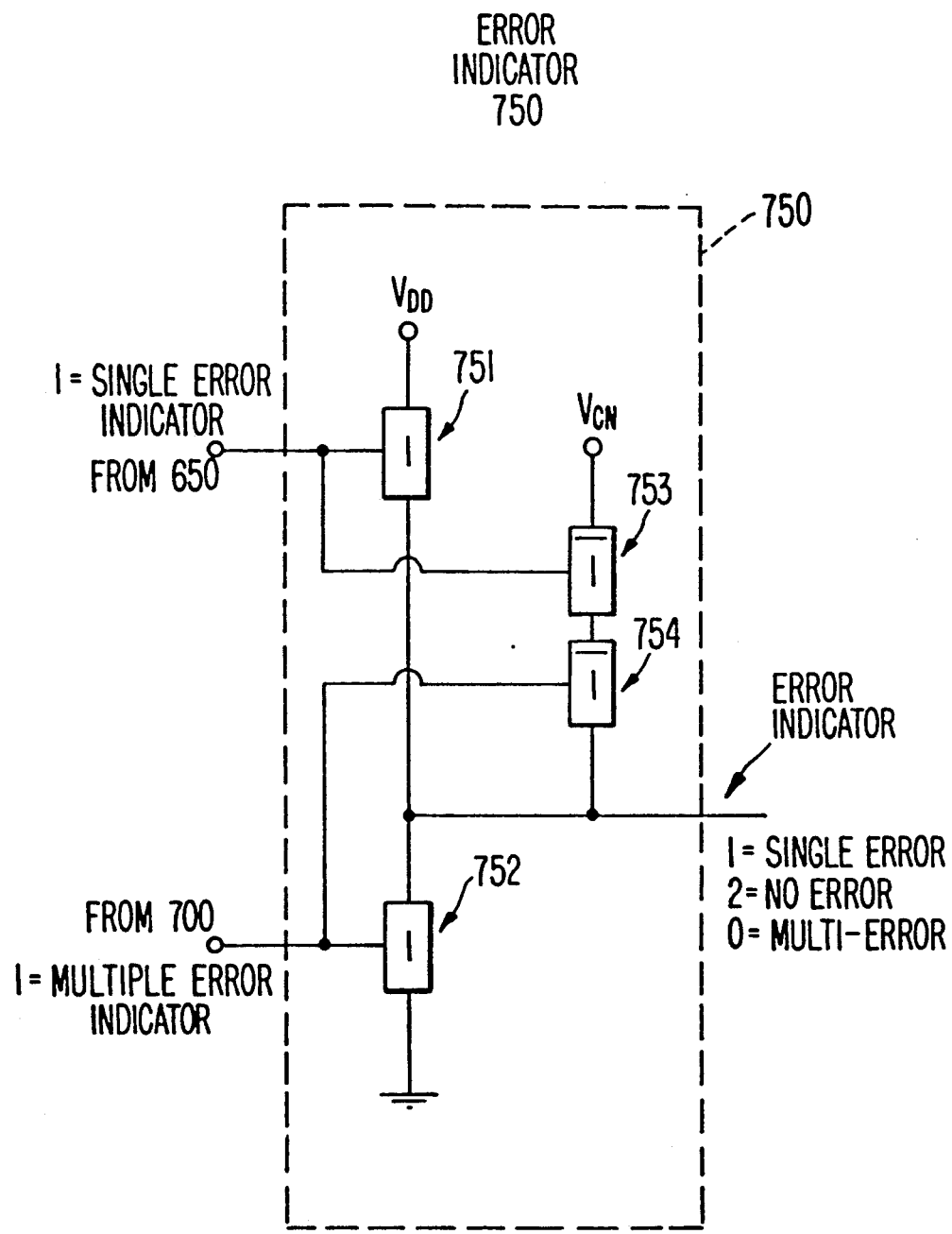

TRINARY LATCH

FIG. 20.

| CMOS DEVICE TYPE | GATE INPUT | DEVICE CONDITION |
|---|---|---|
| P CHANNEL | 0 | ON |
| N CHANNEL | 0 | OFF |
| P CHANNEL | 1 | OFF |
| N CHANNEL | 1 | ON |
| Vt1 | 2 | ON |
| Vt2 | 2 | OFF |

FIG. 21.

CHECK TRIT GENERATOR TRUTH TABLE

| INPUTS A B | CHECK TRIT | A B | CHECK TRIT PLUS 1 | A B | CHECK TRIT MINUS 1 |
|---|---|---|---|---|---|
| 0 0 | 0 | 0 0 | 1 | 0 0 | 2 |
| 0 1 | 1 | 0 1 | 2 | 0 1 | 0 |
| 0 2 | 2 | 0 2 | 0 | 0 2 | 1 |
| 1 0 | 1 | 1 0 | 2 | 1 0 | 0 |
| 1 1 | 2 | 1 1 | 0 | 1 1 | 1 |
| 1 2 | 0 | 1 2 | 1 | 1 2 | 2 |
| 2 0 | 2 | 2 0 | 0 | 2 0 | 1 |
| 2 1 | 0 | 2 1 | 1 | 2 1 | 2 |
| 2 2 | 1 | 2 2 | 2 | 2 2 | 0 |

FIG. 22.

| A | B | B | N1 | N2 | P1 | P2 | C | B | N3 | N4 | P3 | P4 | D | A | N5 | N6 | P5 | P6 | E | E | N7 | N8 | P7 | P8 | CHECK TRIT |
|---|---|---|---|---|---|---|---|---|---|---|---|---|---|---|---|---|---|---|---|---|---|---|---|---|---|
| 0 | 0 | 0 | OFF | OFF | ON | ON | 1 | 0 | OFF | OFF | ON | ON | 1 | 0 | OFF | OFF | ON | ON | 0 | 0 | OFF | OFF | ON | ON | 0 |
| 0 | 1 | 1 | ON | ON | OFF | OFF | 2 | 1 | ON | ON | OFF | OFF | 0 | 0 | OFF | OFF | ON | ON | 1 | 1 | ON | ON | OFF | OFF | 1 |
| 0 | 2 | 2 | ON | OFF | ON | OFF | 0 | 2 | ON | OFF | ON | OFF | 1 | 0 | OFF | OFF | ON | ON | 2 | 2 | ON | OFF | ON | OFF | 2 |
| 1 | 0 | 0 | OFF | OFF | ON | ON | 1 | 0 | OFF | OFF | ON | ON | 2 | 1 | ON | ON | OFF | OFF | 1 | 1 | ON | ON | OFF | OFF | 1 |
| 1 | 1 | 1 | ON | ON | OFF | OFF | 2 | 1 | ON | ON | OFF | OFF | 0 | 1 | ON | ON | OFF | OFF | 2 | 2 | ON | OFF | ON | OFF | 2 |
| 1 | 2 | 2 | ON | OFF | OFF | ON | 0 | 2 | ON | OFF | ON | OFF | 1 | 1 | ON | ON | OFF | OFF | 0 | 0 | OFF | OFF | ON | ON | 0 |
| 2 | 0 | 0 | OFF | OFF | ON | ON | 1 | 0 | OFF | OFF | ON | ON | 2 | 2 | ON | OFF | ON | OFF | 2 | 2 | ON | OFF | ON | OFF | 2 |
| 2 | 1 | 1 | ON | ON | OFF | OFF | 2 | 1 | ON | ON | OFF | OFF | 0 | 2 | ON | OFF | ON | OFF | 0 | 0 | OFF | OFF | ON | ON | 0 |
| 2 | 2 | 2 | ON | OFF | OFF | ON | 0 | 2 | ON | OFF | ON | OFF | 1 | 2 | ON | OFF | ON | OFF | 1 | 1 | ON | ON | OFF | OFF | 1 |

FIG. 23.

| NUMBER OF TRITS / TRYTE SIZE | 0 | 1 | 2 | 3 | 4 | 5 | 6 | 7 | 8 | 9 | 10 | CHECK TRIT # |
|---|---|---|---|---|---|---|---|---|---|---|---|---|
| 5 | 0 | 1 | 2 | 3 | 4 | | | | | | | |
| 6 | 0 | 1 | 2 | 3 | 4 | 5 | | | | | | |
| 7 | 0 | 1 | 2 | 3 | 4 | 5 | 6 | | | | | |
| 8 | 0 | 1 | 2 | 3 | 4 | 5 | 6 | 7 | | | | |
| 9 | 0 | 1 | 2 | 3 | 4 | 5 | 6 | 7 | 8 | | | |
| 10 | 0 | 1 | 2 | 3 | 4 | 5 | 6 | 7 | 8 | 9 | | |
| 11 | 0 | 1 | 2 | 3 | 4 | 5 | 6 | 7 | 8 | 9 | 10 | 1 2 3 4 |

| CHECK TRIT # | | | | | | | | | | | | | |
|---|---|---|---|---|---|---|---|---|---|---|---|---|---|
| 1 | X | X | | X | X | | X | | X | | X | X | |
| 2 | X | | X | X | | X | X | | | X | X | | X |
| 3 | | | X | X | X | | | | X | X | X | | X |
| 4 | | | | | X | X | X | X | X | X | X | | | X |

FOUR (4) TRIT TRINARY ERROR CORRECTION CODES (TECC)

FIG. 24.

| NUMBER OF TRITS / TRYTE SIZE | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | CHECK TRIT # |
|---|---|---|---|---|---|---|---|---|---|---|---|---|---|---|---|---|---|---|---|---|---|---|---|---|---|---|---|
| 12 | 0 | 1 | 2 | 3 | 4 | 5 | 6 | 7 | 8 | 9 | 10 | 11 | | | | | | | | | | | | | | | |
| 13 | 0 | 1 | 2 | 3 | 4 | 5 | 6 | 7 | 8 | 9 | 10 | 11 | 12 | | | | | | | | | | | | | | |
| 14 | 0 | 1 | 2 | 3 | 4 | 5 | 6 | 7 | 8 | 9 | 10 | 11 | 12 | 13 | | | | | | | | | | | | | |
| 15 | 0 | 1 | 2 | 3 | 4 | 5 | 6 | 7 | 8 | 9 | 10 | 11 | 12 | 13 | 14 | | | | | | | | | | | | |
| 16 | 0 | 1 | 2 | 3 | 4 | 5 | 6 | 7 | 8 | 9 | 10 | 11 | 12 | 13 | 14 | 15 | | | | | | | | | | | |
| 17 | 0 | 1 | 2 | 3 | 4 | 5 | 6 | 7 | 8 | 9 | 10 | 11 | 12 | 13 | 14 | 15 | 16 | | | | | | | | | | |
| 18 | 0 | 1 | 2 | 3 | 4 | 5 | 6 | 7 | 8 | 9 | 10 | 11 | 12 | 13 | 14 | 15 | 16 | 17 | | | | | | | | | |
| 19 | 0 | 1 | 2 | 3 | 4 | 5 | 6 | 7 | 8 | 9 | 10 | 11 | 12 | 13 | 14 | 15 | 16 | 17 | 18 | | | | | | | | |
| 20 | 0 | 1 | 2 | 3 | 4 | 5 | 6 | 7 | 8 | 9 | 10 | 11 | 12 | 13 | 14 | 15 | 16 | 17 | 18 | 19 | | | | | | | |
| 21 | 0 | 1 | 2 | 3 | 4 | 5 | 6 | 7 | 8 | 9 | 10 | 11 | 12 | 13 | 14 | 15 | 16 | 17 | 18 | 19 | 20 | | | | | | |
| 22 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | | | | | |
| 23 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | | | | |
| 24 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | | | |
| 25 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | | |
| 26 | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 1 2 3 4 5 |

FIVE (5) TRIT TRINARY ERROR CORRECTION CODES (TECC)

FIGS 23 & 24 ARE THE TRINARY ECC FORMATS FOR VARIOUS TRYTE SIZES (NUMBER OF TRITS PER TRYTE) WHICH CAN BE SUPPORTED BY FOUR (4) AND FIVE (5) CHECK TRITS, RESPECTIVELY. THEY LIST WHICH TRITS ARE USED IN GENERATING THE CHECK TRITS AND IDENTIFY WHICH TRIT IS IN ERROR AND REQUIRES CORRECTION DURING DATA RETRIEVAL.

TRINARY CHECK TRIT GENERATOR, LATCH, COMPARATOR AND MULTIPLEXER

This application is a divisional of application Ser. No. 07/225,976, filed July 29, 1988 now U.S. Pat. No. 4,961,192.

DESCRIPTION

1. Technical Field

The present invention relates to a data error detection and correction and in particular to a system which operates in the trinary mode of 0, 1, and 2.

2. Background

Prior art systems which operate in three-level logic have one of the voltages at a negative level, i.e., voltage levels of $-1, 0, +1$, which are respectively referred to as data quantities of 0, 1, 2. No prior art systems are known to operate with all voltages at single polarity voltage levels to generate data logic of 0, 1, 2 nor are there any known three-level systems which include error detection or correction.

The use of trinary three-level logic offers a variety of advantages over the familiar binary two-level logic with two of these advantages being a reduction in components and increased data capacity.

However, before trinary data can be depended upon for processing information, there must be an error detection and correction function performed on the data during movement or storage of the data. The use of trinary data is sparse in the prior art. There are no known techniques for trinary data error handling.

Trinary data (described herein as the three logic levels, 0, 1, 2) has been used to transmit data between binary logic units (see U.S. Pat. No. 4,631,428 assigned to International Business Machines Corporation). However, this type of trinary data has not been used to perform logic functions which require error checking. As trinary data and logic become more widely used in data processing as a technique to increase capacity, so will the need to perform error checking and correction.

Some of the broad error detection and correction functions used in binary such as generating parity bits from data; using parity bits to generate syndrome elements; using syndrome elements to detect errors and to generate signals for correction of errors are useful in a general way for trinary. However, the use of the known binary techniques for trinary error detection and correction is not possible without making considerable basic and unique changes to these functions which are not apparent to one attempting to use trinary data.

The binary approach to error detection and correction and the problems associated with applying these techniques to trinary error detection and correction can be described by examining some of the basic prior art:

U.S. Pat. No. 4,523,314 discloses an error indicating system for use with a binary error detection and correction system. The system diagram in FIG. 1 includes the basic functions needed to perform an error detection and correction. These are: reading in and storing data while generating first check bits; reading out the stored data and generating second check bits; using the syndrome bits to indicate errors and to signal error correction circuitry. The problems encountered in using the system disclosed in U.S. Pat. No. 4,523,314 or a similar binary system in the trinary mode of the invention are numerous. The basic problems are the storing of trinary data; the generation of a check trit; the generation of syndrome elements; the error decoder and error detection procedure; and the error correction function. The known techniques for performing these functions in binary are not applicable to a trinary system without making unique and basic changes to the known prior art. Known binary storage devices such as latches do not exist for trinary.

Binary check bit generators cannot be used as is or altered to perform the generation of trinary check trits. The binary syndrome generators are AND logic groups and do not function to generate three-level syndrome elements. Error detection and correction techniques in binary are based on the principle of errors have changed data from 0 to 1 or 1 to 0. U.S. Pat. No. 4,523,314 uses adders and carry detectors since binary loss or gain will be detected by loss or gain of carry. Trinary error correction techniques have to determine the level of data error, i.e. 0, or 1, or 2. None of the binary logic or techniques including the use of adders and carry detectors are therefore applicable.

U.S. Pat. Nos. 3,755,779; 3,896,416 and 4,631,725 are typical binary error correction systems which generate check bits and syndrome elements to perform error correction. Comparison of syndrome generation techniques show the use of modulo-two and summations to generate the syndrome bits. The binary one-zero summations are relatively simple from a logic standpoint, however, this approach could not be applied to trinary.

Not only do problems exist in using the binary techniques in generating syndrome elements in trinary, but also in using the syndrome elements to first detect, and then correct errors. Detection of the error in binary requires only the identification of the error bit location and not the type of error, i.e., whether a error bit location has increased or decreased. In binary, increase of a "zero" sets the bit to "one" while decrease of a "zero" also sets the bit to "one". Increase of a "one", sets the bit to "zero". Therefore in error detection for binary only the fact that the bit has changed need be recognized. In trinary, increase or decrease of trit position will set the trit of 0, 1, or 2 at any of the three levels. To perform error detection which can be used to perform correction in trinary type of error, i.e., an increase in value or a decrease in value must be established since the error can place the data value at one of three levels: 0, 1, or 2.

To perform data correction in binary requires merely that the bit position in error be reversed, i.e., 0 to 1, or 1 to 0. Correction of a dropped bit (decrease in value) or a picked-up bit (increase in value) is performed by bit reversal See U.S. Pat. No. 3,755,779, Col. 20, lines 21-28 and U.S. Pat. No. 4,631,725, Col. 7, lines 5-12.

In summary, to perform data correction in trinary requires that the error be identified as to whether the data position has increased or decreased since a different value will exist for each condition. Also, the correction must perform either an incrementing or a decrementing of the bit position to restore the data to the original condition. Therefore, application of the known binary techniques of detection of errors by any change which occurs to data from 0 to 1 or 1 to 0 as similar and correction of this error by merely reversing that data is not applicable to trinary.

There is therefore a need for performing error detection and correction on three-level logic data which is not within the capabilities of the prior art binary systems and which overcomes the problems in trying to apply the binary concepts to trinary or other multi-level logic.

SUMMARY OF THE INVENTION

It is accordingly an object of this invention to error detect and correct data in a multi-level logic mode and in particular for data in a three-level logic mode (trinary).

It is another object of the invention to provide trinary error detection logic.

It is another object of the invention to develop trinary check data for activating error detection logic.

It is another object of the invention to develop trinary error correction logic.

It is another object of the invention to provide a trinary comparator unit for generating syndrome trits.

It is another object of the invention to multiplex trinary data to perform error correction.

It is another object of the invention store trinary data.

These and other objects are achieved according to the invention by a method and apparatus which uses a trit of trinary data (which is at the 0, or 1, or 2 level compared to a bit of binary data at the 0, or 1 logic level). As trits of data are being read into a first register, a first series of check trits are generated which are unique for each particular group of trits placed in the first register. As the trits of data are subsequently removed from the first register, a second series of check trits are generated and compared against the first series of check trits which have been placed in a second register. If the check trits generated from the data trits removed from the first register are identical to the check trits generated from the data trits read into the first register, the data into and data out of the first register is considered to be identical and no error is associated with the register storage procedure. However, if the check trits are not identical, an error is considered present. Any storage devices such as memory could be used in place of the registers.

The identification of an error present and the type of error is performed by error detection logic. If the error detection logic identifies the error as a single trit error, the error correction logic is gated. If the error is detected as a multiple trit error or no error the error correction logic is not gated and indicators show which condition exits.

The error correction unit either increments or decrements the trit in error to perform a correction based on the indication from the single error detection logic as to the type of correction which is necessary.

BRIEF DESCRIPTION OF THE DRAWINGS

FIG. 10A is a schematic logic diagram of the trinary logic comparator.

FIG. 11 is a schematic circuit diagram of the single error detector (SED).

FIG. 11A is an expanded schematic circuit of the 610 logic in single error detector 600.

FIG. 11B is the schematic logic diagram of the single error detector OR device.

FIG. 15 is a logic diagram of the decrementor unit.

FIG. 15A is a logic diagram of a trinary decrementor.

FIG. 15B is a chart indicating the condition of the decrementor logic devices for the trinary inputs.

FIG. 17 is a logic diagram of the error indicator (EI).

FIG. 20 is a chart of the MOSFET devices and the conditions during trinary inputs to the gates.

FIG. 21 is a truth table for the check trit generator of FIG. 3.

FIG. 22 is a chart indicating the condition of logic devices and switching points for the check trit generator of FIG. 3.

FIG. 23 is a table of trinary error correction code formats for various tryte sizes up to a trit total of eleven.

FIG. 24 is a table illustrating trinary error correction code formats for tryte sizes up to a total of 26 trits.

GENERAL DESCRIPTION OF THE PREFERRED EMBODIMENT

Figure 1:
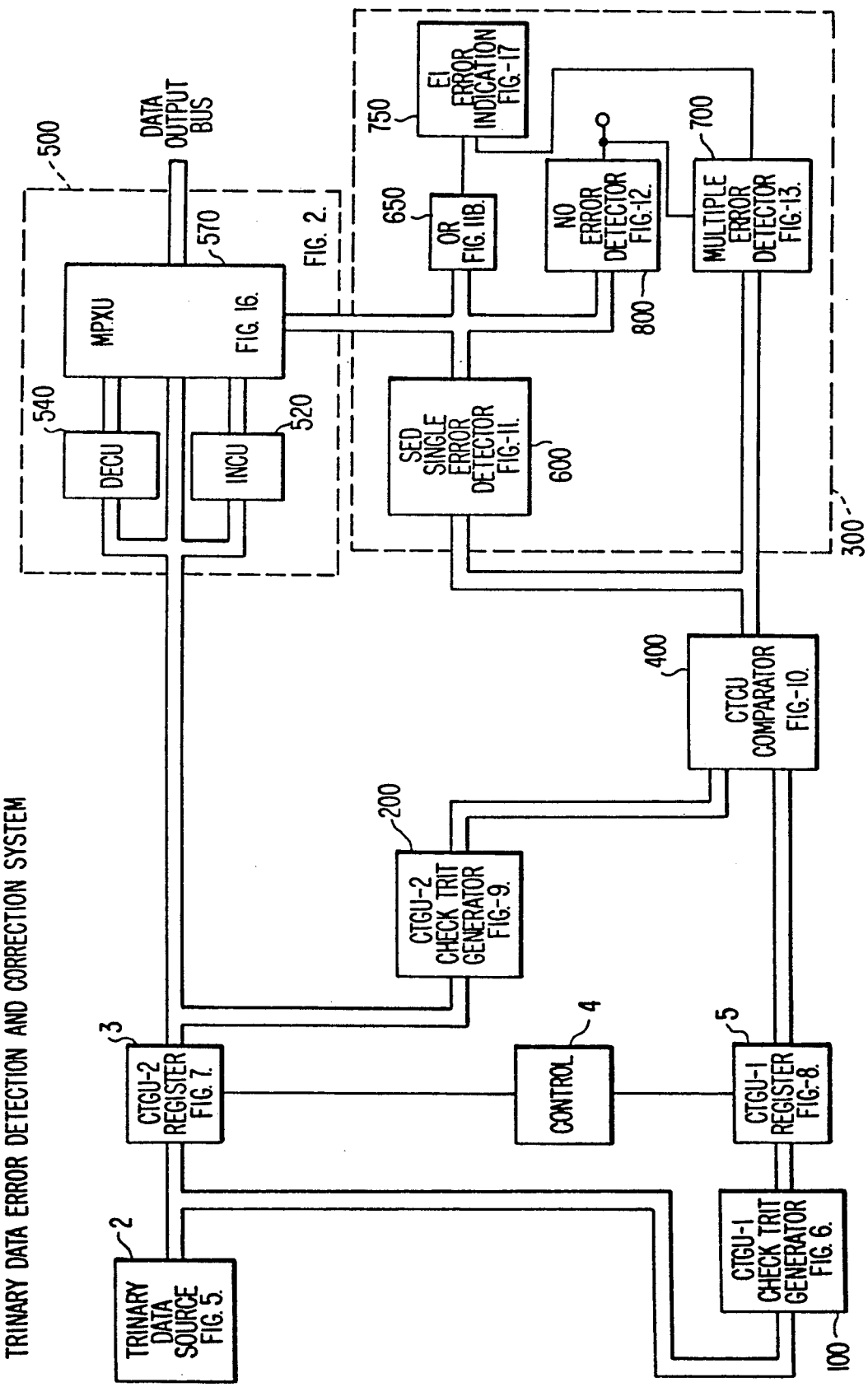
FIG. 1 is a block diagram of the trinary data error detection and correction system.

A block diagram of the complete trinary error detection and correction system is shown in FIG. 1. A data tryte which is a group of trits ranging in number from 5 to 26, as illustrated in FIGS. 23 and 24 is input from trinary data source 2. For descriptive purposes, a tryte size of 9 trits will be established therefore setting n=9. The data tryte (9 trits) is read from the trinary data source 2 into register 3 and also into check trit generator unit 100 by control 4. Check trit generator unit 100 develops four check trits for each tryte of nine data trits input as illustrated in FIG. 23. The four generated check trits are read into register 5 on lines CT1-1 to CT1-4.

Figure 18:
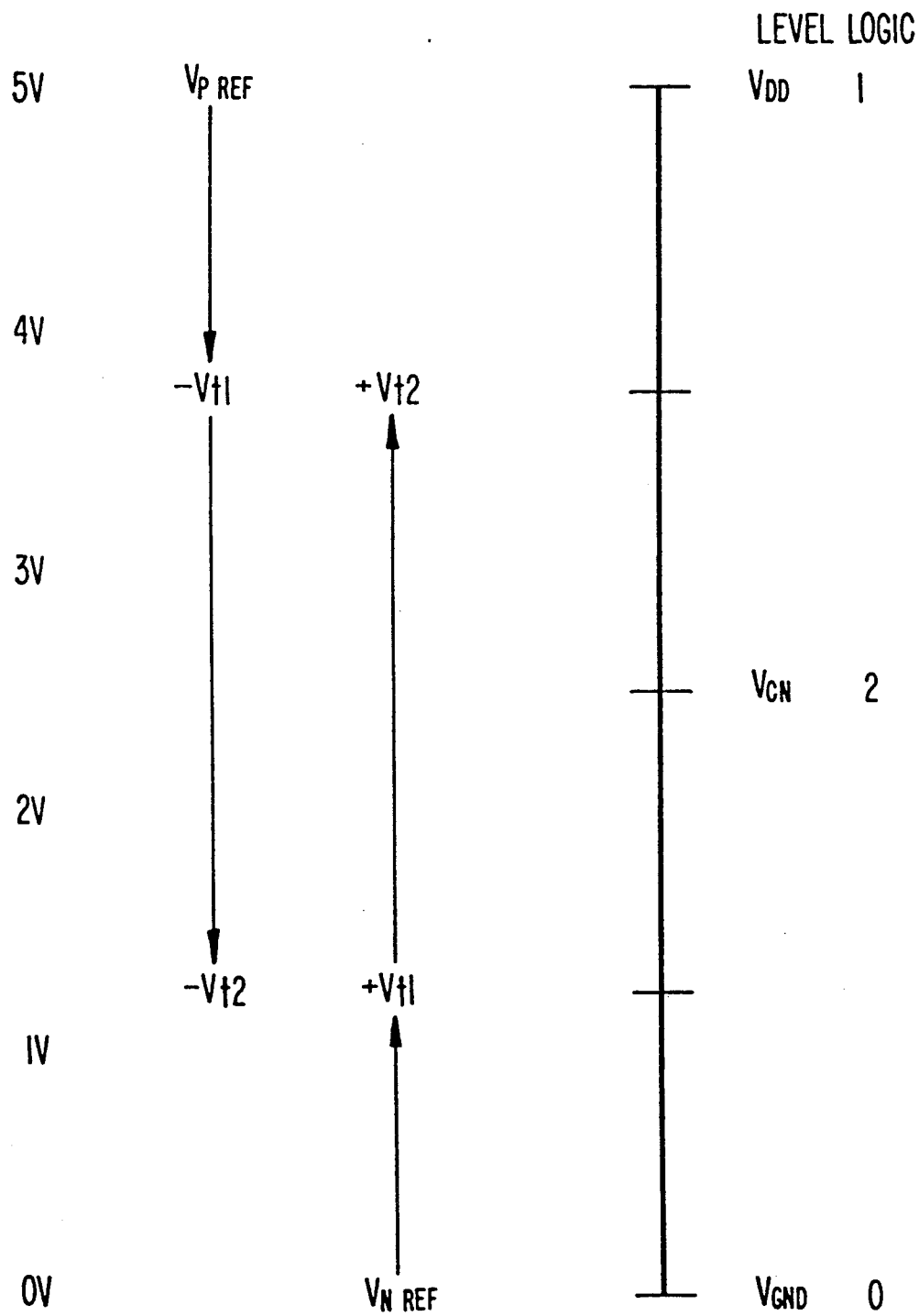
FIG. 18 is a drawing illustrating the voltage levels used in the trinary logic system.

Upon read out of the data tryte of nine trits from register 3 on lines D0-D8, the nine trits are read into another check trit generator unit 200 for development of another four check trits as previously performed by check trit generator 100 at the time that the data tryte was originally read into register 3. The two pairs of four generated check trits from 100 via register 5 and from check trit generator unit 200 are then compared in check trit comparator unit 400. The comparator develops a syndrome trit for each of the four check trit comparisons and places the four syndrome trits developed on lines SY1-SY4 for input to the single error detector 600 and multiple error detector 700 in error detection unit 300. The data tryte read from register 3 is also directed to the data corrector 500 on lines D0-D8 as well as having been read into check trit generator unit 200. The data tryte will pass through the data corrector 500 either error free untouched, error free corrected, or with a multiple error-uncorrectable condition based on the syndrome trits developed in the check trit comparator unit 400. Each individual operation is shown in block diagram form in the figures and will be described in more detail as follows:

The MOSFET logic devices used in the trinary functional devices of the invention use the following basic parameters and functions as shown in FIG. 18:

Trinary logic level zero (0) is ground.
Trinary logic level one (1) is VDD.
Trinary logic level two (2) is VCN ($\frac{1}{2}$ VDD).
+VT1 and +Vt2 are the switching thresholds of the N-channel MOSFET's reference to ground. −Vt1 and −Vt2 are the switching thresholds of the P-channel MOSFET's reference to +VDD.

A P-channel MOSFET with −Vt1 switches at 25% of the way down from +$V_{DD}$ toward ground.

A P-channel MOSFET with −Vt2 switches at 75% of the way down from +$V_{DD}$ toward ground.

An N-channel MOSFET with +Vt2 switches at 75% of the way up from ground toward +$V_{DD}$.

An N-channel MOSFET with +Vt1 switches at 25% of the way up from ground toward +VDD.

This is illustrated in FIG. 18.

Although MOSFET logic devices are used in describing the invention, any multi-level logic devices or circuitry could be used to perform the logic described in the specification.

Check Trit Generator

Figure 3:
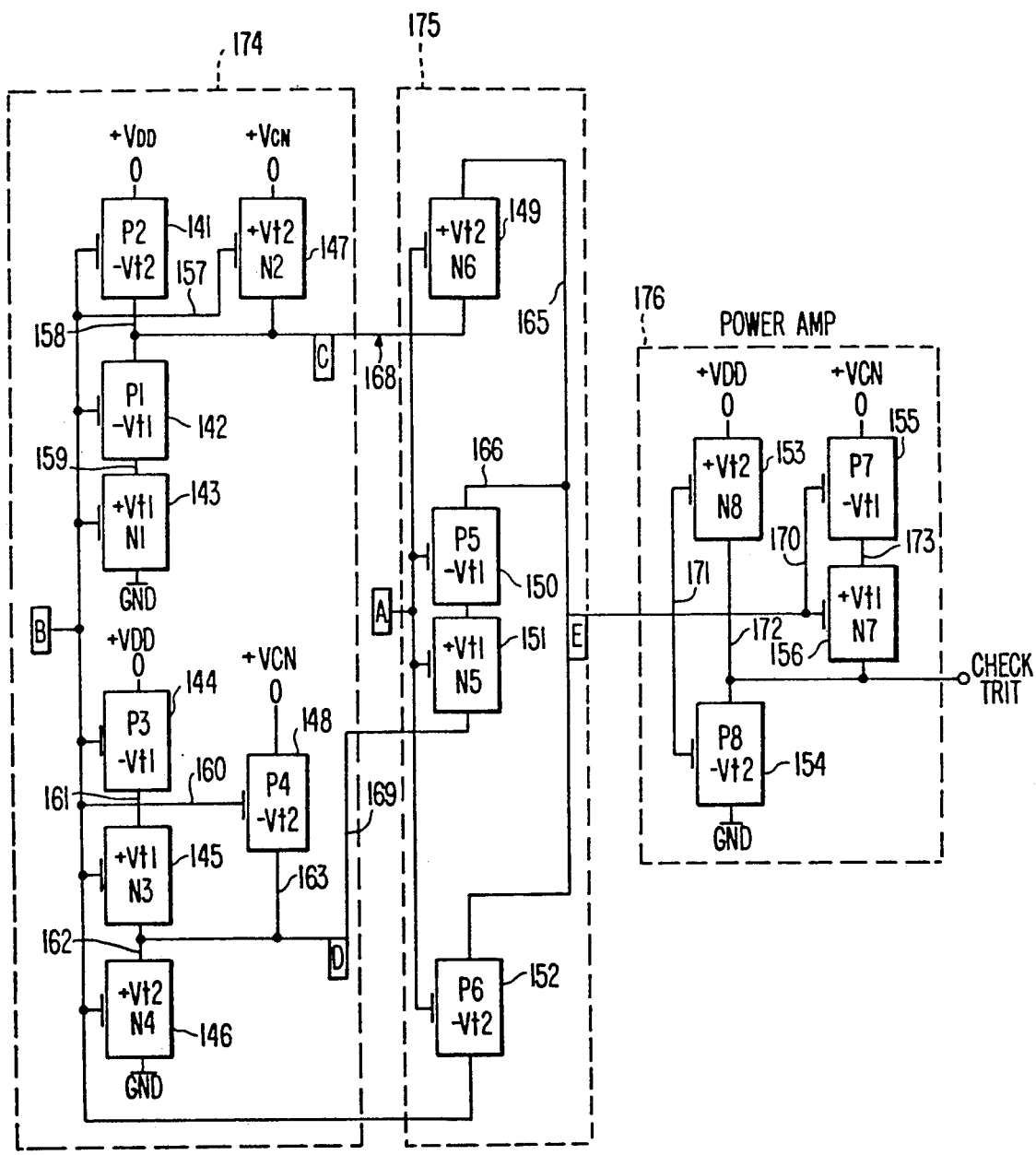
FIG. 3 is a schematic logic diagram of the trinary check trit generator.
Figure 4:
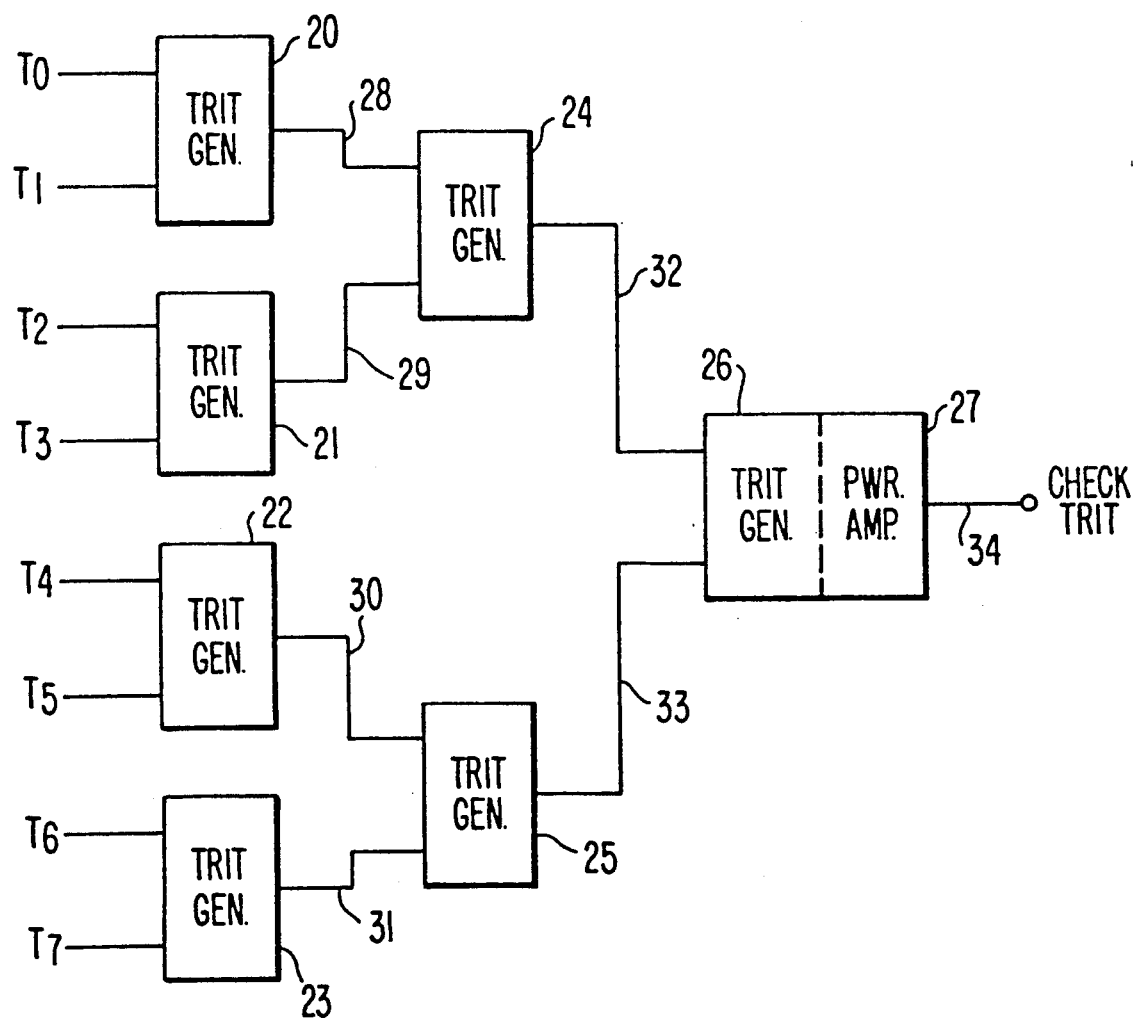
FIG. 4 is a schematic logic diagram of the check trit generator tree.

Basic to the trinary error detection and correction of FIG. 1 is the check trit generator of FIG. 3 which develops a unique check trit for each pair of trinary trit inputs. Multiple check trit generators can be combined as shown in FIG. 4 to develop a check trit for multiple pairs of trinary trit inputs. This technique is used in the check trit generator units 100 and 200 where individual check trit generators are combined in several configurations. The check trit generator of FIG. 3 from a functional standpoint divides the trinary logic devices into three operating groups. The first group 174, including devices 141-148, based on the trinary input at B will set a trinary logic level on three points. The second group 175, including devices 149-152 based on the trinary input at A will open one of the points to permit the trinary level placed at that point by the B input to pass to an output point E. The third group 176, including devices 153-156 amplify the trinary level at the output point E. This amplified output is the particular trinary check trit for the trinary inputs at A and B.

The trinary logic devices shown in the circuit schematic of FIG. 3 follow the basic rules of operation shown in FIG. 20 for generating a check trit output for all possible combinations of trinary logic levels on the two inputs A and B. FIG. 22 indicates the conditions of all the devices of FIG. 3 and the logic levels at points C, D, E and the output check trit. Combining the basic rules of MOSFET operation shown in FIG. 20, and the MOSFET conditions in FIGS. 21 and 22, the function of the check trit generator of FIG. 3 will be described.

Referring to FIG. 22 and FIG. 3 for the inputs of 0, 0 on lines A and B, the logic input of zero (0) on line A causes 149 and 151 to be "off" since N-channel devices are "off" for a zero input and 150 and 152 will be "on" for a zero input. 149 "off" blocks the logic level at C from passing through to E. 151 "off" blocks logic level at point D from passing through 151 to 150 which is "on" to point E. Therefore, the level at point E will be controlled by 152 "on" passing the input on the B line to E. Since the level on B is zero, the level at E will be zero. The logic level of zero (0) on line B causes 143, 147, 145 and 146 to be "off" and 142, 141, 144 and 148 to be "on". 143 being off blocks the ground level (0) from passing through 142 (on) to the point C. 147 being off blocks the VCN level (logic 2) from passing through to point C. 141 being on will allow the VDD level (logic 1) to pass through to the point C. However, 149 being off from the zero level at input A blocks the passage of the VDD level (1) at point C from passing through to point E. Therefore, at point E will be zero (logic 0). The (0) level at E causes 156 and 153 to be "off" and 155, 154 to be "on". 156 being off blocks the passage of the VCN level (2) from passing through 155 to the output. 153 being "off" blocks the passage of the VDD level (1) from passing through to the output. However, 154 being "on" allows the ground level (0) to pass through to the output making the check trit output a (0) for an input of 0, 0. The trinary logic inputs at A and B control the CMOS devices to place either a ground level (0), a VCN level (2), or a VDD level (1) at point E. The logic level at point E controls the CMOS devices in the power amp to place the check trit output at a particular logic level.

For the input of 0, 1 at inputs A, B the (0) input at A will place 151 and 149 "off" and 150 and 152 "on". The (−1) input at B will place 143, 147, 145 and 146 "on" and 142, 141, 144, and 148 "off". As described for the 0, 0 input, input A being at (0) will block points C and D from passing through to point E by 151 and 149 being "off". Therefore, regardless of the condition of 141, 142, 144 and 148 and 143, 145, 146 and 147 effecting points C and D, these will have no effect on point E. 152 being "on" will allow passage of the (1) level at B to pass through making the level at E a (1). A (1) level at E will cause 155 and 154 to be "off" and 156 and 153 to be "on". 155 being "off" blocks the VCN (2) output and 154 being "off" blocks the ground (0) output. 153 being "on" allows the VDD level (1) to pass to the check trit output. Therefore, for an input of 0, 1 the check trit is a (1).

For an input 0, 2 at inputs A, B, 151 and 149 will be "off" and 150 and 152 will be "on" based on (0) input on A. As shown in FIG. 22, the (2) logic level on B will cause the Vt1 devices of 142, 144, 143 and 145 to be "on" and cause the Vt2 devices of 141, 148 and 147 and 146 to be "off". Here again, as for inputs 0, 0 and 0, 1, the (0) on input A for logic input 0, 2 will block points C and D from affecting the level at E. Level E will be controlled again by device 152 being on and passing the (2) level at input B through to point E. The (2) at point E will cause Vt1 devices of 155 and 156 to be "on" and the Vt2 devices of 153 and 154 to be "off". 154 being off blocks the ground level (0) and 153 being "off" blocks the VDD level (1). 155 and 156 being "on" allows the VCN level (2) to pass to the output. Therefore, for an input of 0, 2 the check trit is a (2).

For an input of 1, 0 at inputs A, B the devices 151, 149 will be "on" and devices 150 and 152 will be "off" based on the (1) input at A. Based on the (0) input at B, devices 143, 147, 145 and 146 will be off and 142, 141, 144 and 148 will be "on". 150 being off will block point D from affecting the output, while 152 being off will block point B from affecting point E. 149 being "on" will allow passage of point C to point E. 147 being off will block the VCN level (2) from passing to point C. 143 being "off" will block the ground level (0) from passing to point C. 141 being "on" will allow the VDD level (1) to pass to point C and through 149 to point E. The (1) at E will cause 156 and 153 to be "on" and 155 and 154 to be "off". 155 being "off" blocks the passage of VCN while 154 being "off" blocks the passage of ground level (0) to the output. Therefore 153 being "on" controls the output by allowing passage of VDD (1) to the check trit output. Therefore, for an input of 1, 0 the check trit is (1).

For an input of 1, 1 at inputs A, B, the devices 150 and 152 will be "off" and 151, 149 will be "on" based on the (1) input at A. Devices 141, 142, 144, and 148 will be "off" and 143, 145, 146 and 147 will be "on" based on the (1) input at B. Here again, as in the 1, 0 input, 150 and 152 being "off" will block points D and B from passing to point E; therefore, the level at point C will pass through to point E. 142 being "off" will block the ground level through 143, and 141 being "off" will block the VDD level (1). Therefore, 147 being "on" allows the VCN level (2) to pass to point C and through 149 to point E. The (2) trinary logic level at E turns the Vt1 devices of 155 and 156 "on" and the Vt2 devices of 153 and 154 "off". 155 and 156 being "on" allows the VCN level (2) to pass to the check trit output. Therefore, for an input of 1, 1, the check trit is (2).

For an input of 1, 2 at inputs A, B the devices 150 and 152 will be "off" and 151, 149 will be "on" based on the (1) input at A. The Vt1 devices 142, 144, 143, 145 will be "on", and Vt2 devices 141, 148, 147, 146 will be "off" based on the (2) input at B. As in the 1, 0 and 1, 1 input condition, the level at point C will pass through to point E. 142 and 143 being "on" will allow ground level (0) to pass to point C and through 149 "on" to point E. A (0) at point E will cause 155 and 154 to be "on" and 156 and 153 to be "off". 156 blocks the VCN level, and 153 blocks the VDD level while 154 being "on" passes the ground level (0) to the check trit output. Therefore, for a 1, 2 input the check trit is (0).

For an input of 2, 0 at inputs A, B the Vt1 devices 151 and 150 will be "on" and the Vt2 devices 149 and 152 will be "off" based on the (2) level input at A. Devices 141, 142, 144 and 148 will be "on", and devices 143, 145, 146 and 147 will be "off", based on the (0) level input at B. 151 and 150 being "on" will allow the level at point D to pass through to point E while 149 and 152 being "off" will block all other levels from passing to point E. 145 and 146 being "off" will block the VDD level and ground level, respectively, while 148 being "on" will reverse the VCN level (2) to point D and to point E through 151, 150. The (2) at E will turn "on" Vt1 devices 156 and 155 while turning "off" Vt2 devices 153 and 154. 153 and 154 block the VDD and ground levels, respectively, while 156 and 155 being "on" allow the VCN level (2) to pass to the output. Therefore, for a 2, 0 input the check trit is (2).

For a 2, 1 input at A, B the Vt1 devices 151 and 150 will be "on", and the Vt2 devices 149 and 152 will be "off", based on the (2) level input at A. Devices 141, 142, 144 and 148 will be "off" and 143, 145, 146 and 147 will be "on", based on the (1) input at B. As in the 2, 0 input, the conditions of 150, 151, 149 and 152 will pass point D to point E. 144 and 148 being "off" will block VDD and VCN, respectively, from point D while 146 being "on" will pass level ground (0) to point D through 151 and 150 to point E. The (0) at point E will turn "on" 155 and 154 and turn "off" 156 and 153. 156 and 153 will block the VCN and VDD levels while 154 being "on" will pass ground level (0) to the output. Therefore, for a 2, 1 input, the check trit is (0).

For a 2, 2 input at A, B the Vt1 devices 143, 145, 151 142, 144 and 150 are "on" while the Vt2 device 147, 146, 149, 141, 148 and 152 are "off". 152 blocks input B while 149 blocks point C from passing to E. 151 and 150 being "on" allow point D to pass to E. 148 and 146 being "off" block the VCN and ground levels from point D while 145 and 144 being "on" allow the VDD level (−1) to pass to D and through 151, 150 to point E. The (1) at E turns 155, 154 "off" and 156, 153 "on". The 155, 154 being "off" block VCN and ground levels while 153 being "on" allows the VDD level (1) to pass to the output. Therefore, for a 2, 2 input, the L check trit is a (1).

The trinary check trit generator of FIG. 3 therefore develops a trinary check trit 0, 1, 2 for all combinations of trinary logic levels on two inputs.

The trinary check TRIT generator provides a check TRIT (equivalent to a parity bit in binary) based on input of trinary data (0, 1, 2) on two lines.

Check Trit Generator Tree

Referring to FIG. 4, the check trit generator tree combines a series of the 2-trit generators of FIG. 3 in a tree arrangement to generate a check trit for multiple pairs of trinary inputs. Four pairs of inputs T0 and T1, T2 and T3, T4 and T5, T6 and T7 are applied to trit generators 20, 21, 22 and 23, respectively. The four outputs from the trit generators are obtained as described for input A and B in FIG. 3. The four outputs 28, 29, 30 and 31 are combined in pairs and applied to trit generators 24 and 25. The two outputs from these generators on 32 and 33 are input to the final trit generator 26 and power amp 27 to obtain the check trit on output line 34. Thus, a single check trit is generated for an input of eight data trits. A combination of input lines and check trit generator configurations can be used to obtain a check trit.

Trinary Data Source

Figure 5:
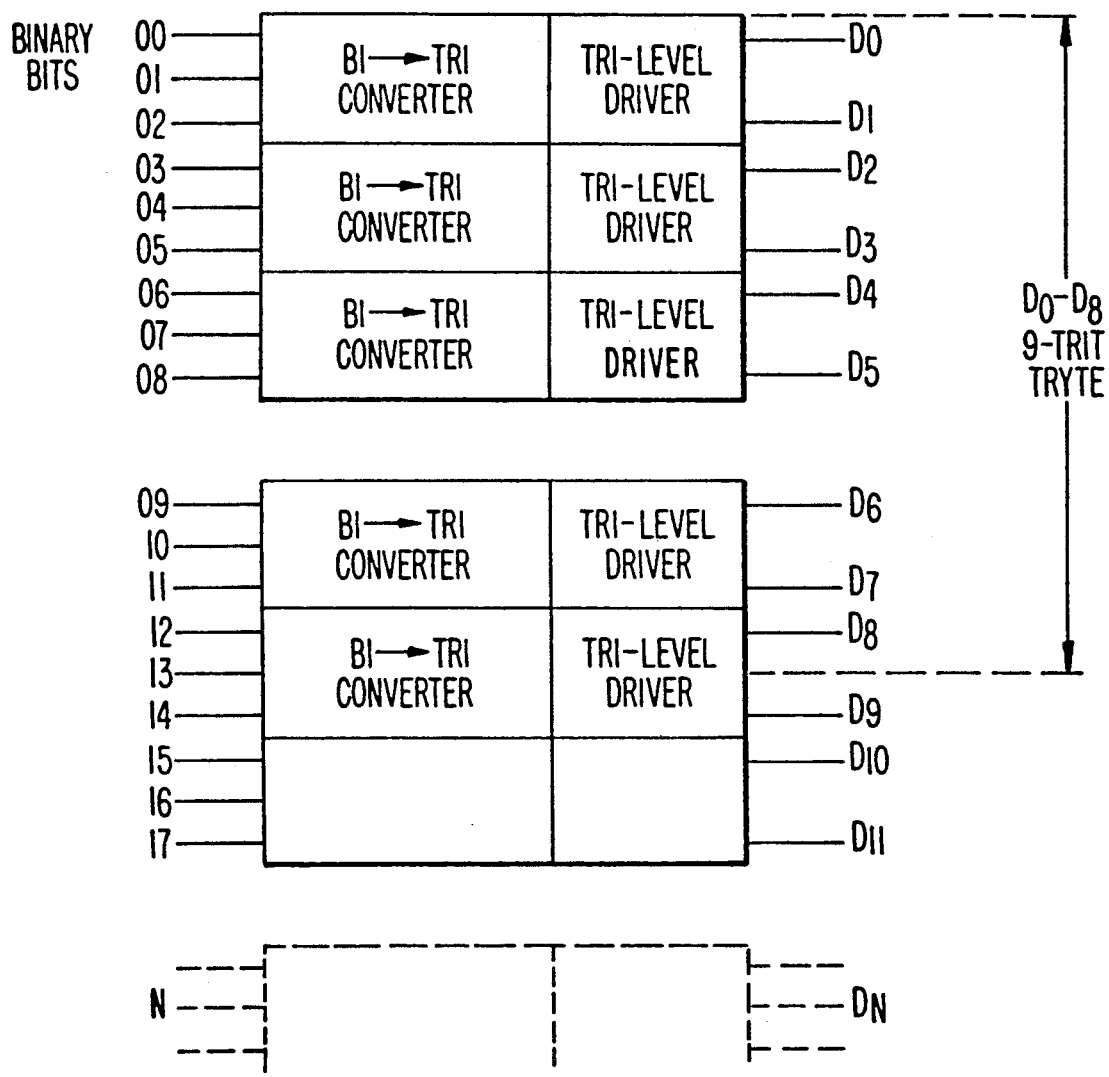
FIG. 5 is a schematic circuit diagram for the trinary data source.

Referring to FIG. 5, the trinary data source 2 in FIG. 1 is shown as a binary to trinary converter. The details of this converter are described in U.S. Pat. No. 4,631,428 to the same inventor and assignee. However, this is merely to illustrate a particular trinary data source. The invention which is a trinary error detection and correction system could be used with other sources of trinary data.

Trinary Logic Latch

The latch operates to latch in any of the trinary logic levels placed on the data-in line under control of the trinary clock. Provision is also made for scanning in test data.

Figure 19:
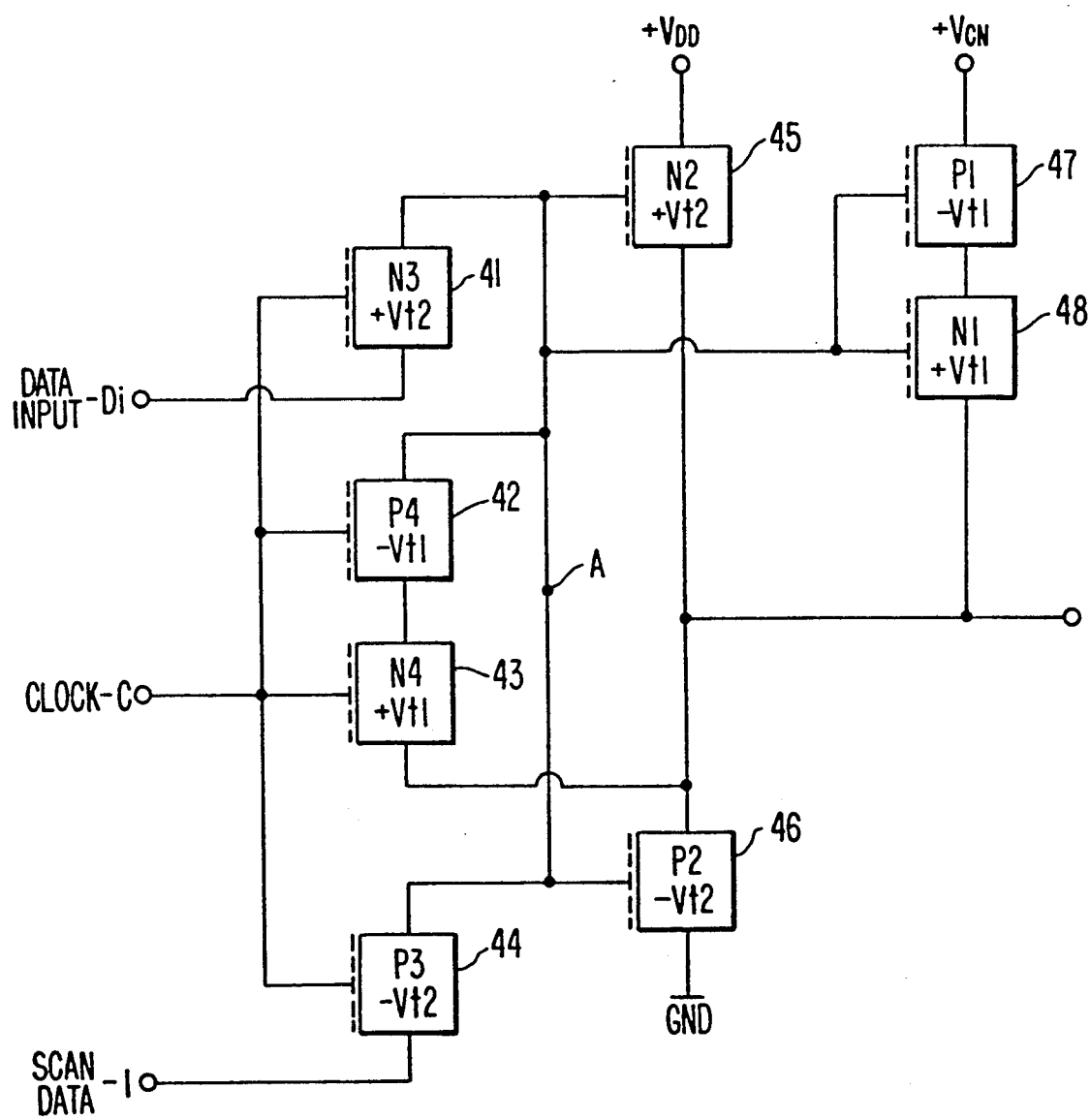
FIG. 19 is a logic diagram of a trinary latch.

Referring to FIG. 19, as in the other trinary logic devices, N channel and P channel MOSFETs are indicated by an N or P, respectively. Enhancement MOSFETs, have a five-part gate. Vt1 and Vt2 (Voltage threshold 1 and 2) are ⅓ of ⅔ of the absolute value of VDD. The +Vt is referenced to ground. The −Vt1 is referenced to +VDD. The threshold voltages are set as follows:

47, 42 $-Vt1 = -\frac{1}{3}$ VDD ref. VDD 46, 44 $-Vt2 = -\frac{2}{3}$ VDD ref. VDD 45, 41 $+Vt2 = +\frac{2}{3}$ VDD ref. Gnd 48, 43 $+Vt1 = +\frac{1}{3}$ VDD ref. Gnd The trinary clock has three functions:

1 = gate Di (data input)

2 = latch mode

0 = gate I (scan data in)

When the clock is logic 1, it is above 41's +Vt2; therefore, 41 is on, gating input data into the latch. The clock's logic 1 is above 44's −Vt2, turning it off and inhibiting scan data input. The clock's logic 1 turns 43 on, but 42 is off; thus, the latchback from data output D0 to common connection A through 43-42 is inhibited. Data input is gated by a logic 1 level on the clock. The trinary level at node A controls 45, 46, and 48-47, providing an output at D0 equivalent to the signal at node A. A logic 1 at node A turns 45 on, sourcing D0 to +VDD, logic 1. A logic 0 at node A turns on 46, sinking D0 to ground, logic 0. A logic 2 at node A turns on 48 and 47, sourcing D0 to −VCN, logic 2.

The latch condition is with the clock at logic 2. When the clock switches from logic 1 to logic 2, the data which was gated by clock logic 1 is latched by the clock logic 2 state. 41 switches off, and 43 and 42 switch on. 41 is turned off by the clock's +VCN level (logic 2) being below 41's +Vt2; therefore, input data is inhibited. 43 is turned on by the +VCN clock level being above its +Vt1, and 42 is turned on by the +VCN clock level being below its −Vt1. D0 is fed back through 43-42 to node A. This is the latch-up condition. In this example, input data is latched, because the clock 2 state was entered from clock 1 state.

When the clock is logic 0, it is below 44's −Vt2; therefore, 44 is on, gating scan data I into the latch. The clock's logic 0 is below 41's +Vt2, turning it off and inhibiting data Di input. The clock's logic 0 turns 42 on, but 43 is off; thus, the latchback from D0 to node A through 43-42 is inhibited. Scan data is gated by a logic 0 level on the clock. The trinary level at node A controls 45, 46, and 48-47, providing an output at D0 equivalent to the signal at node A. A logic 1 at node A turns 45 on, sourcing D0 to +VDD, logic 1. A logic 0 at node A turns on 46, sinking D0 to ground, logic 0. A logic 2 at node A turns on 48 and 47, sourcing D0 to +VCN, logic 2.

The latch condition is with the clock at logic 2. When the clock switches from logic 0 to logic 2, the scan data which was gated by clock logic 0 is latched by the clock logic 2 state. 44 switches off, and 43 and 42 switch on. 44 is turned off by the clock's +VCN level (logic 2) being above 44's −Vt2; therefore, scan data is inhibited. 43 is turned on by the +VCN clock level being above its +Vt1, and 42 is turned on by the +VCN clock level being below its −Vt1. D0 is fed back through 43-42 to node A. This is the latch-up condition. In this example, scan data is latched, because the clock 2 state was entered from clock 0 state.

Input data/scan data is gated at the leading edge of clock logic level 1/0, respectively. The selected input is latched at the trailing edge of clock 1 or 0 transition to level 2. Input transitions between clocks have no effect on the latch. When functional data is being clocked by clock level 1, scan data is a don't-care; conversely, when scan data is being clocked by clock level 0, input data is a don't-care When the selected data/scan changes during a clock, the output changes accordingly, and the state of the selected input is latched when the clock switches to level 2.

CTGU-2 Register

Figure 7:
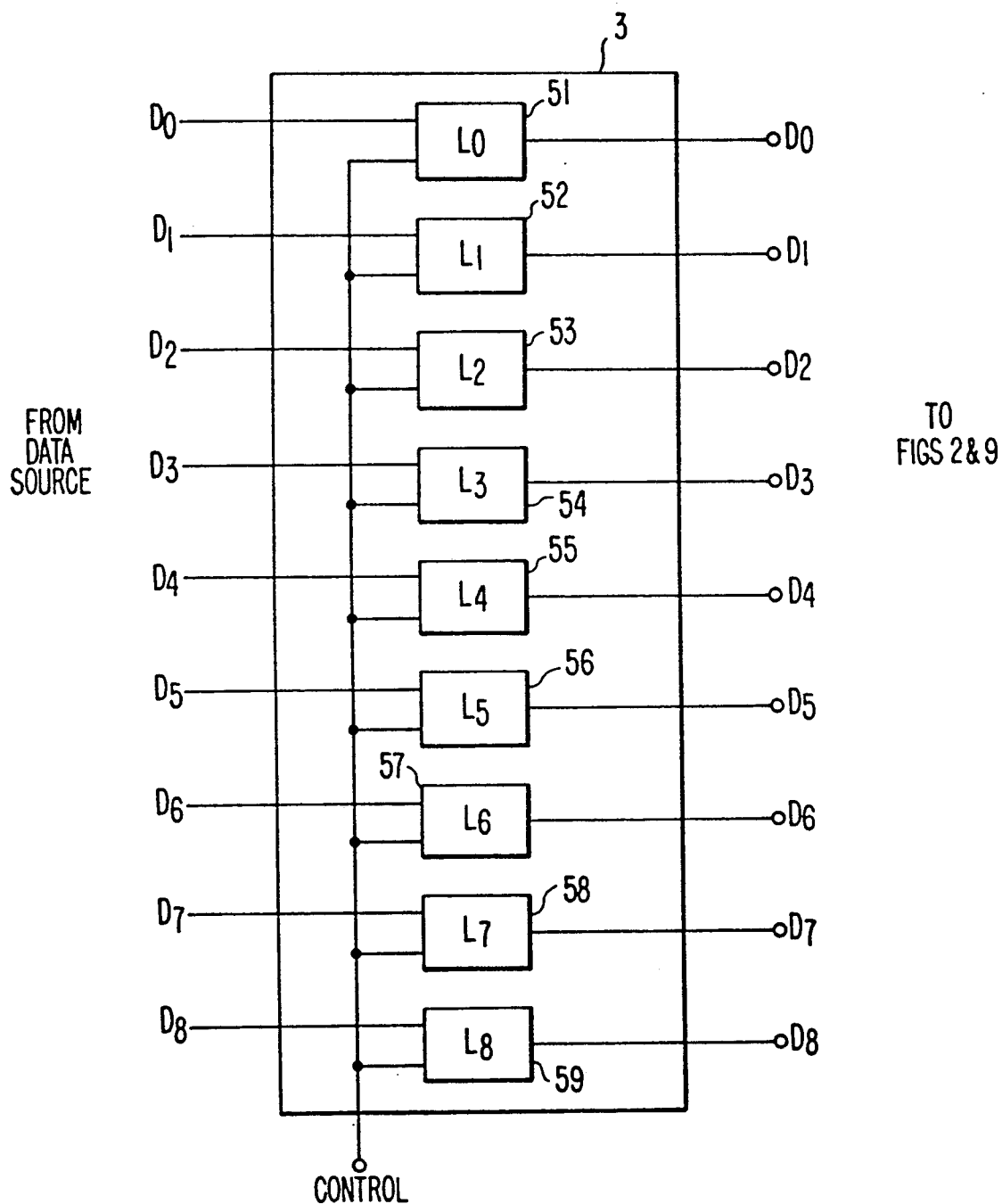
FIG. 7 is a schematic arrangement of the check trit generator 2 register (CTG-2).

Referring to FIG. 7, the CTGU-2 register 3 receives a trinary tryte of data on lines D0-D8 from the trinary data source 2. The register comprises nine trinary latches 51-59 which store the individual trits under direction of the control unit 4. After a selected time the tryte stored in the register is read out to the data corrector 500, FIG. 2, and also to the check trit generator unit-2, 200 under direction of the control unit. Although a register is used as the storage device for purposes of describing the function of the invention, any trinary device which receives data which is to be checked for error upon a later read-out could be substituted.

CTGU-1 Register

Figure 8:
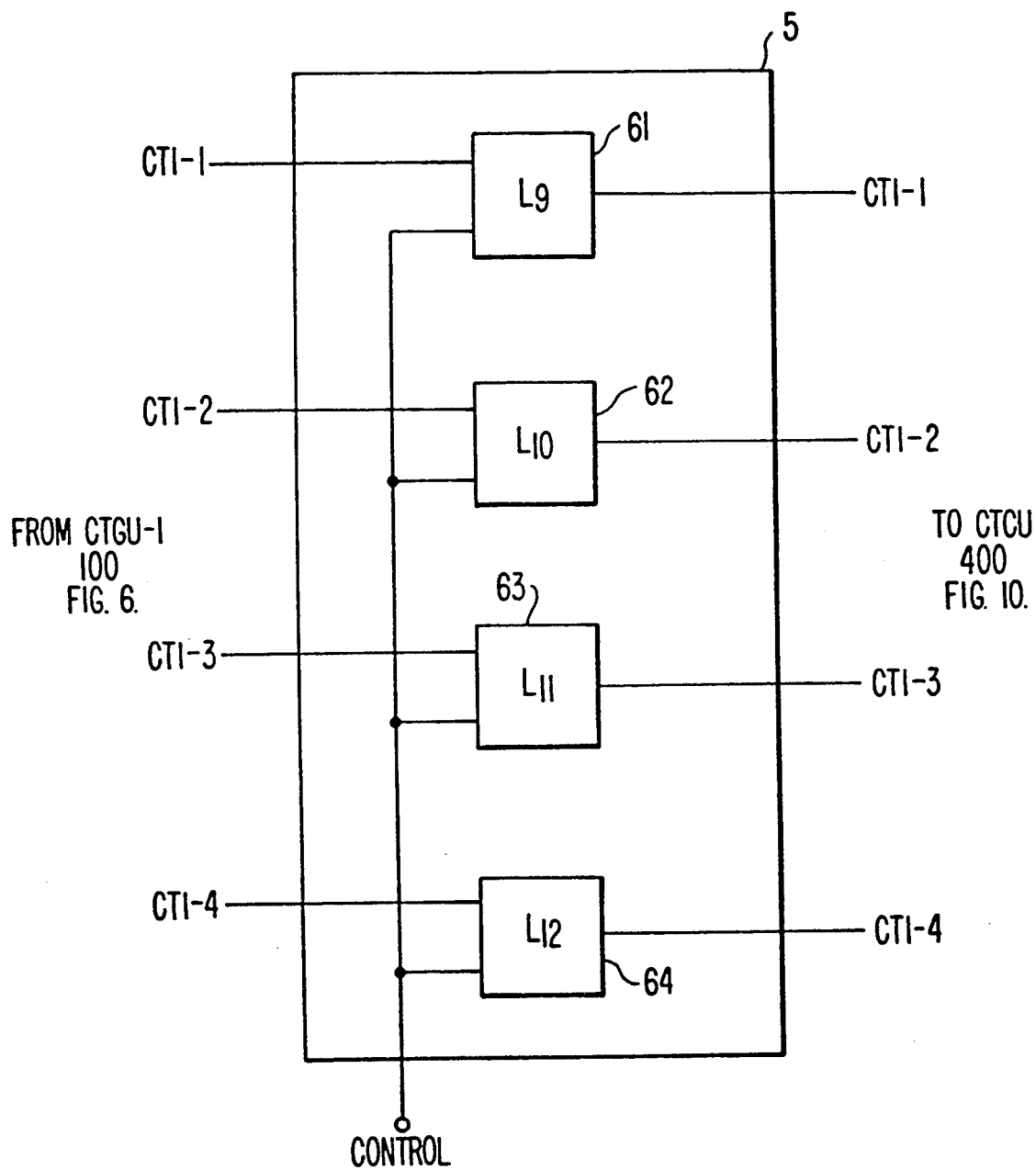
FIG. 8 is a schematic arrangement of the check trit generator 1 register (CTG-2).

Referring to FIG. 8, the CTGU-1 register 5 receives four check trits from CTGU-1 on lines CT1-1 to CT1-4 into trinary latches 61-64. The operation of the trinary latch is shown in FIG. 19. The four check trits are transferred from the register to the check trit comparator unit CTCU 400 under direction of the control unit.

Control Unit

The control unit comprises a clocking system and combinatorial and sequential logic system for controlling the writing of trinary data into and the reading of trinary data out of the CTGU-1 and CTGU-2 registers. The trinary data is presented to CTGU-1 and CTGU-2 by the trinary data source 2.

In some applications, a signal from trinary data source 2 is sent to control 4 to indicate that trinary data is on the buss and ready for latching into CTGU-1 and CTGU-2 registers. At that time control 4 provides the control signals and clocks to CTGU-1 and CTGU-2 registers to latch in the trinary data and trinary check trits.

In other applications, control 4 determines when new trinary data is needed from trinary data source 2 and sends a request signal to trinary data source 2. Control 4 waits a predetermined time for the trinary data to be presented by trinary data source 2 and generates the control signals and clocks to CTGU-1 and CTGU-2 registers to latch in the trinary data and trinary check trits.

The trinary data is gated out of CTGU-1 and CTGU-2 registers by the control 4 at the appropriate time to be used by the device receiving by way of the data output bus, the corrected trinary data output of the trinary data error detection and correction system.

Check Trit Generator Unit

CTGU-1 and CTGU-2 are functionally identical in generating four check trits for each data tryte of nine trits input. The basic functional unit used by the CTGUs is the check trit generator CTG shown in FIG. 3 and in a tree arrangement in FIG. 4.

Figure 6:
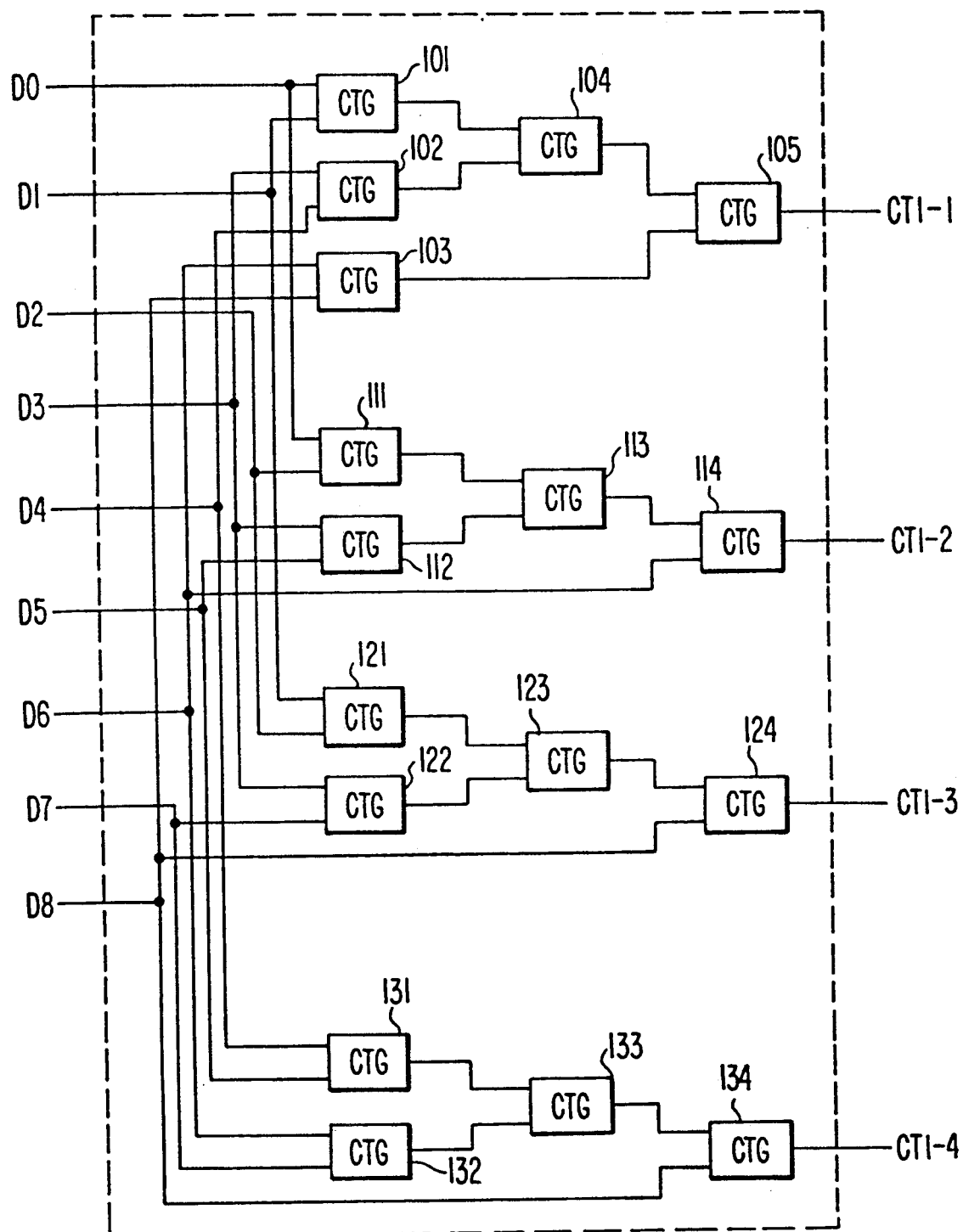
FIG. 6 is a schematic diagram of the check trit generator unit 1 (CTGU-1).

Referring to FIG. 6, check trit generator unit 100 provides four check trits according to the levels of the nine trinary data inputs D0-D8. CTG in circuits 101-134 is an abbreviation for check trit generator. The outputs of circuits 105-134 are labeled CT1-1 through CT1-4 for the check trits 1-4. The inputs to the check trit generator are connected following the table in FIG. 23, Four Trit Trinary Error Correction Codes (TECC).

Circuits 101-105 generate check trit 1, CT1-1. In the lower half of the table in FIG. 23, check trit 1 has x's under data trits 0, 1, 3, 4, 6, and 8. (The x under data trit 10 is not used in this nine trit tryte—data trit 8 is the last input used. The x's indicate which data trits are used to generate each check trit. D0 and D1 are connected to CTG 101. D3 and D4 are connected to CGT 102. D6 and D8 are connected to CTG 103.

Each CTG circuit generates trinary parity (balance) on its output according to the trinary levels on its two inputs. Circuit 101 generates trinary parity on the D0 and D1 inputs. Circuit 102 generates trinary parity on the D3 and D4 inputs. Circuit 103 generates trinary parity on the D6 and D8 inputs. Circuit 104 generates trinary parity on the outputs of circuits 101 and 102. Circuit 105 generates trinary parity on the outputs of circuits 103 and 104.

For the case in which D0-D8 are at trinary levels 012001122; D0, D1, D3, D4, D6, and D8 are trinary 010012, respectively. D0 and D1 inputs at trinary 0 and 1 into circuit 101 generates trinary parity 1. D3 and D4 inputs at trinary 0 and 0 into circuit 102 generates trinary parity 0. D6 and D8 inputs at trinary 1 and 2 into circuit 103 generates trinary parity 0. Circuits 101 and 102 provide trinary 1 and 0 into circuit 104 which generates a trinary 1 parity. Circuits 104 and 103 provide trinary 1 and 0 into circuit 105 which generates a trinary 1 parity. The output of circuit 105 is the resultant CT1-1 (check trit unit 1, check trit 1).

Circuits 111-114 generate check trit 2, CT1-2. In the lower half of the table in FIG. 23, check trit 2 has x's under the data trits 0, 2, 3, 5, and 6. (The x's under data trits 9 and 10 are not used in this nine trit tryte—data trit 8 is the last input used). D0 and D2 are connected to CTG 111. D3 and D5 are connected to CTG 112. D6 is connected to CTG 114.

Each CTG circuit generates trinary parity on its output according to the trinary levels on its two inputs. Circuits 111 generates trinary parity on the D0 and D2 inputs. Circuit 112 generates trinary parity on the D3 and D5 inputs. Circuit 113 generates trinary parity on the outputs of circuits 111 and 112. Circuit 114 generates trinary parity on the output of circuit 113 and D6.

For the case in which D0-D8 are at trinary levels 012001122; D0, D2, D3, D5, and D6 are trinary 02011, respectively. D0 and D2 inputs at trinary 0 and 2 into circuit 111 generates trinary parity 2. D3 and D5 inputs at trinary 0 and −1 into circuit 112 generates trinary parity 1. Circuits 111 and 112 provide trinary 2 and 1 into circuit 113 which generates a trinary 0 parity. Circuit 113 and D6 provide trinary 0 and 1 into circuit 114 which generates a trinary 1 parity. The output of circuit 113 is the resultant CT1-2 (check trit unit 1, check trit 2).

Circuits 121-124 generate check trit 3, CT1-3. In the lower half of the table in FIG. 23, check trit 2 has x's under data trits 1, 2, 3, 7, and 8. (The x's under data trits 9 and 10 are not used in this nine trit tryte—data trit 8 is the last input used). D1 and D2 are connected to CTG 121. D3 and D7 are connected to CTG 122. D8 is connected to CTG 124.

Each CTG circuit generates trinary parity on its output according to the trinary levels on its two inputs. Circuit 121 generates trinary parity on the D1 and D2 inputs. Circuit 122 generates trinary parity on the D3 and D7 inputs. Circuit 123 generates trinary parity on the outputs of circuits 121 and 122. Circuit 124 generates trinary parity on the output of circuit 123 and D8.

For the case in which D0-D8 are at trinary levels 012001122; D1, D2, D3, D7, and D8 are trinary 12022, respectively. D1 and D2 inputs at trinary 1 and 2 into circuit 121 generates trinary parity 0. D3 and D7 inputs at trinary 0 and 2 into circuit 122 generates trinary parity 2. Circuits 121 and 122 provide trinary 0 and 2 into circuit 123 which generates a trinary 2 parity. Circuit 123 and D8 provide trinary 2 and 2 into circuit 124 which generates a trinary 1 parity. The output of circuit 123 is the resultant CT1-3 (check trit unit 1, check trit 3).

Circuits 131-134 generate check trit 4, CT1-4. In the lower half of the table in FIG. 23, check trit 3 has x's under data trits 4, 5, 6, 7, and 8. (The x's under data trits 9 and 10 are not used in this nine trit tryte—data trit 8 is the last input used). D4 and D5 are connected to CTG 131. D6 and D7 are connected to CTG 132. D8 is connected to CTG 134.

Each CTG circuit generates trinary parity on its output according to the trinary levels on its two inputs. Circuit 131 generates trinary parity on the D4 and D5 inputs. Circuit 132 generates trinary parity on the D6 and D7 inputs. Circuit 133 generates trinary parity on the outputs of circuits 131 and 132. Circuit 134 generates trinary parity on the output of circuit 133 and D8.

For the case in which D0-D8 are at trinary levels 012001122; D4, D5, D6, D7, and D8 are trinary 01122, respectively. D4 and D5 inputs at trinary 0 and 1 into circuit 131 generates trinary parity 1. D6 and D7 inputs at trinary 1 and 2 into circuit 132 generates trinary parity 0. Circuits 131 and 132 provide trinary 1 and 0 into circuit 133 which generates a trinary 1 parity. Circuit 133 and D8 provide trinary 1 and 2 into circuit 134 which generates a trinary 0 parity. The output of circuit 133 is the resultant CT1-4 (check trit unit 1, check trit 4).

Figure 9:
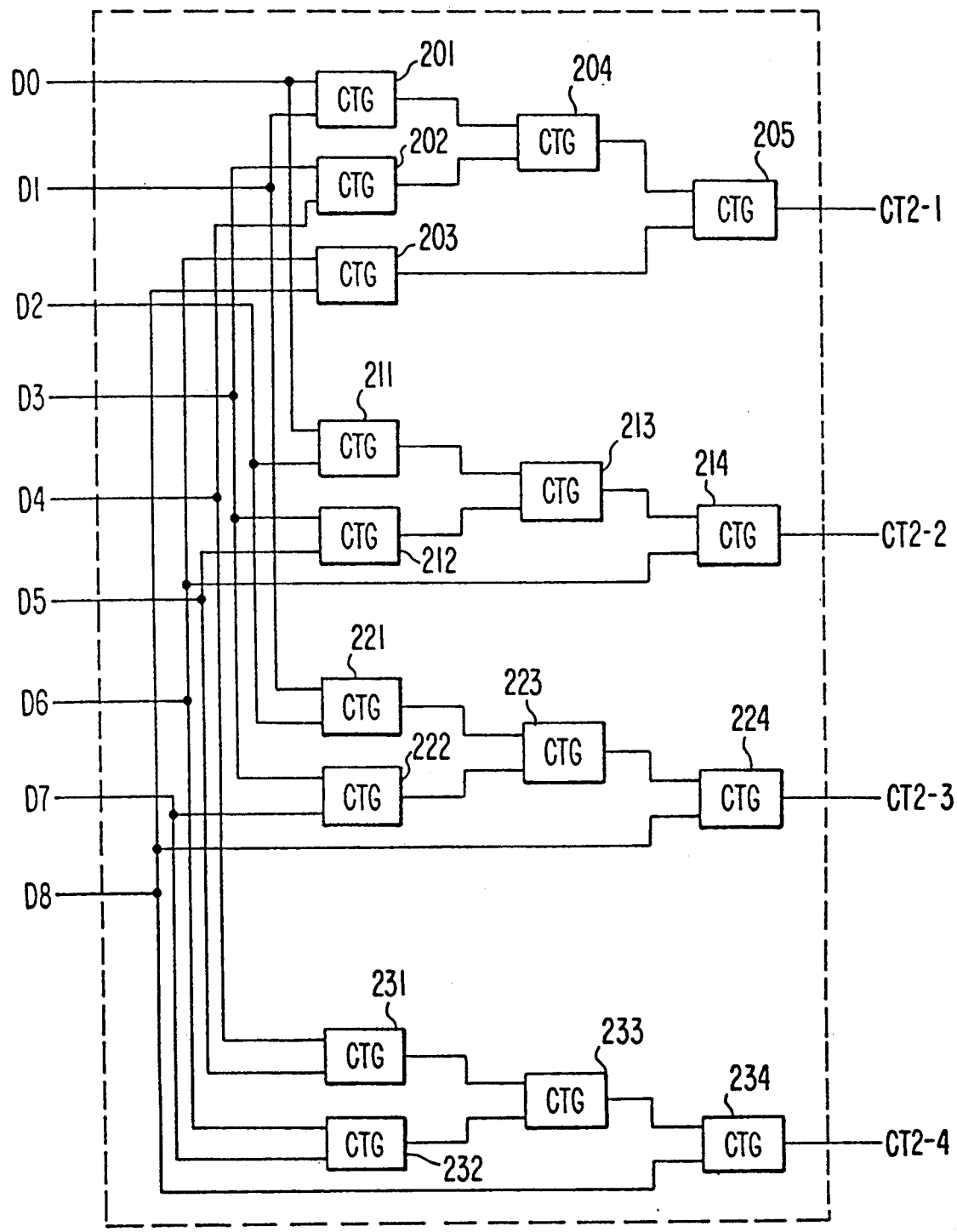
FIG. 9 is a schematic diagram of the check trit generator unit 2 (CTGU-2).

Referring to FIG. 9, check trit generator unit 200 provides four check trits according to the levels of the nine trinary data inputs D0-D8. CTG in circuits 201-234 is an abbreviation for check trit generator. The outputs of circuits 205-234 are labeled CT2-1 through CT2-4 for the check trits 1-4. The inputs to the check trit generator are connected per the table in FIG. 23, Four Trit Trinary Error Correction Codes (TECC).

Circuits 201-205 generate check trit 1, CT2-1. In the lower half of the table in FIG. 23, check trit 1 has x's under data trits 0, 1, 3, 4, 6, and 8. (The x under data trit 10 is not used in this nine trit tryte—data trit 8 is the last input used0. The x's indicate which data trits are used to generate each check trit. D0 and D1 are connected to CTG 201. D3 and D4 are connected to CGT 202. D6 and D8 are connected to CTG 203.

Each CTG circuit generates trinary parity (balance) on its output according to the trinary levels on its two inputs. Circuit 201 generates trinary parity on the D0 and D1 inputs. Circuit 202 generates trinary parity on the D3 and D4 inputs. Circuit 203 generates trinary parity on the D6 and D8 inputs. Circuit 204 generates trinary parity on the outputs of circuits 201 and 202. Circuit 205 generates trinary parity on the outputs of circuits 203 and 204.

For the case in which D0-D8 are at trinary levels 12001122; D0, D1, D3, D4, D6, and D8 are trinary 010012, respectively. D0 and D1 inputs at trinary 0 and 1 into circuit 201 generates trinary parity 1. D3 and D4 inputs at trinary 0 and 0 into circuit 202 generates trinary parity 0. D6 and D8 inputs at trinary 1 and 2 into circuit 203 generates trinary parity 0. Circuits 201 and 202 provide trinary 1 and 0 into circuit 204 which generates a trinary 1 parity. Circuits 204 and 203 provide trinary 1 and 0 into circuit 205 which generates a trinary 1 parity. The output of circuit 205 is the resultant CT2-1 (check trit unit 2, check trit 1).

Circuits 211-214 generate check trit 2, CT2-2. In the lower half of the table in FIG. 23, check trit 2 has x's under the data trits 0, 2, 3, 5, and 6. (The x's under data trits 9 and 10 are not used in this nine trit tryte—data trit 8 is the last input used). D0 and D2 are connected to CTG 211. D3 and D5 are connected to CTG 212. D6 is connected to CTG 214.

Each CTG circuit generates trinary parity on its output according to the trinary levels on its two inputs. Circuits 211 generates trinary parity on the D0 and D2 inputs. Circuit 212 generates trinary parity on the D3 and D5 inputs Circuit 113 generates trinary parity on the outputs of circuits 211 and 212. Circuit 214 generates trinary parity on the output of circuit 213 and D6.

For the case in which D0-D8 are at trinary levels 012001122; D0, D2, D3, D5, and D6 are trinary 02011, respectively D0 and D2 inputs at trinary 0 and 2 into circuit 211 generates trinary parity 2. D3 and D5 inputs at trinary 0 and 1 into circuit 112 generates trinary parity 1. Circuits 211 and 212 provide trinary 2 and 1 into circuit 213 which generates a trinary 0 parity. Circuit 213 and D6 provide trinary 0 and 1 into circuit 214 which generates a trinary 1 parity. The output of circuit 213 is the resultant CT2-2 (check trit unit 2, check trit 2).

Circuits 221-224 generate check trit 3 CT2-3. In the lower half of the table in FIG. 23, check trit 2 has x's under data trits 1, 2, 3, 7, and 8. (The x's under data trits 9 and 10 are not used in this nine trit tryte—data trit 8 is the last input used). D1 and D2 are connected to CTG 221. D3 and D7 are connected to CTG 222. D8 is connected to CTG 224.

Each CTG circuit generates trinary parity on its output according to the trinary levels on its two inputs. Circuit 221 generates trinary parity on the D1 and D2 inputs. Circuit 222 generates trinary parity on the D3 and D7 inputs. Circuit 223 generates trinary parity on the outputs of circuits 221 and 222. Circuit 224 generates trinary parity on the output of circuit 223 and D8.

For the case in which D0-D8 are at trinary levels 012001122; D1, D2, D3, D7, and D8 are trinary 12022, respectively. D1 and D2 inputs at trinary 1 and 2 into circuit 221 generates trinary parity 0. D3 and D7 inputs at trinary 0 and 2 into circuit 222 generates trinary parity 2. Circuits 221 and 222 provide trinary 0 and 2 into circuit 223 which generates a trinary 2 parity. Circuit 223 and D8 provide trinary 2 and 2 into circuit 224 which generates a trinary 1 parity. The output of circuit 223 is the resultant CT2-3 (check trit unit 2, check trit 3).

Circuits 231-234 generate check trit 4, CT1-4. In the lower half of the table in FIG. 23, check trit 3 has x's under data trits 4, 5, 6, 7, and 8. (The x's under data trits 9 and 10 are not used in this nine trit-tryte—data trit 8 is the last input used). D4 and D5 are connected to CTG 231. D6 and D7 are connected to CTG 232. D8 is connected to CTG 234.

Each CTG circuit generates trinary parity on its output according to the trinary levels on its two inputs. Circuit 231 generates trinary parity on the D4 and D5 inputs. Circuit 232 generates trinary parity on the D6 and D7 inputs. Circuit 233 generates trinary parity on the outputs of circuits 231 and 232. Circuit 234 generates trinary parity on the output of circuit 233 and D8.

For the case in which D0-D8 are at trinary levels 012001122; D4, D5, D6, D7, and D8 are trinary 01122, respectively. D4 and D5 inputs at trinary 0 and 1 into circuit 231 generates trinary parity 1. D6 and D7 inputs at trinary 1 and 2 into circuit 232 generates trinary parity 0. Circuits 231 and 232 provide trinary 1 and 0 into circuit 233 which generates a trinary 1 parity. Circuit 233 and D8 provide trinary 1 and 2 into circuit 234 which generates a trinary 0 parity. The output of circuit 233 is the resultant CT2-4 (check trit unit 2, check trit 4).

Check Trit Comparator

Figure 10:
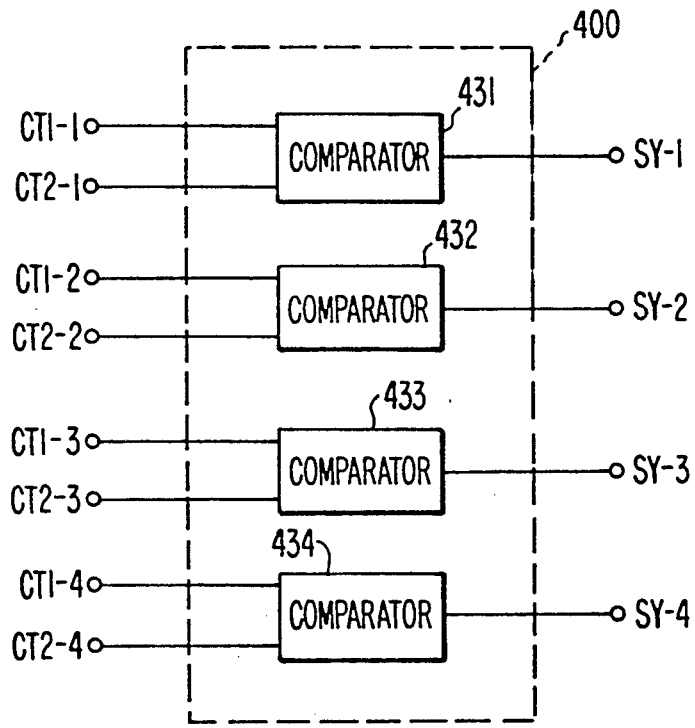
FIG. 10 is the schematic arrangement of the check trit comparator unit (CTCU).

FIG. 10 illustrates the circuit schematic for the check trit comparator unit 400 (FIG. 1) used for comparing check trits. FIG. 10A illustrates the logic operation of the trinary logic comparator which is the basic unit 431-434 of the check trit comparator unit 400 (FIG. 10).

Referring to FIG. 10A, two trinary level signals, A and B, are input at four points, and based on the compared values of A and B, a trinary output is obtained. The outputs are:

A is more than B—output is 1

A is equal to B—output is 2

A is less than B—output is 0

The TCLC circuit schematic is in FIG. 10A. N channel and P channel MOSFETs are indicated by an N or P, respectively. Enhancement MOSFETs have a three-part gate. Vt1 and Vt2 (voltage threshold 1 and 2) are one fourth or three fourths of the absolute value of VDD. The +Vt is referenced to ground. The −Vt is referenced to +VDD. The threshold voltages are set as follows:

| P3 P6 P7 P8 | $-V_{t1} = -\frac{1}{4} VDD$ | ref. VDD |
|---|---|---|
| P1 P4 P9 P10 | $-V_{t2} = -\frac{3}{4} VDD$ | ref. VDD |
| N2 N5 N9 N10 | $+V_{t1} = -\frac{3}{4} VDD$ | ref. Gnd |
| N1 N3 N4 N6 N7 N8 | $+V_{t2} = -\frac{1}{4} VDD$ | ref. Gnd |

The output is (0) Gnd when A is less than B. The output is sunk to Gnd by 404-403. 403 is on when A is 0, and 404 is on when B is not 0. B0=B1+B2; therefore, A0B0=A0B1+A0B2. As can be seen by inspection, A is less than B in both A0B1 and A0B2. The output is also sunk to Gnd by 410-409-408. 410 is on when A=1, and 409-408 are on when b=2. 408 is on when B is below ¾ VDD, and 409 is on when B is above ¼ VDD; therefore, they are both on when B is at the Center voltage level. So, the output equals 0 when the inputs are A1B2; again, by inspection, note that A1 is less than B2.

The output is (1)+VDD when A is greater than B. The output is sourced to +VDD by 402-401. 402 is on when A is not 0, and 401 is on when B is 0. A0=A1+A2; therefore, A0B0=A1B0+A2B0. As can be seen by inspection, A is greater than B in both A1B0 and A2B0. The output is also sourced to +VDD by 407-406-405. 407 is on when B=1 and 406-405 are on when A=2. 405 is on when A is below ¾ VDD, and 406 is on when A is above ¼ VDD; therefore, they are both on when A is at the Center voltage level. So, the output equals 1 when the inputs are A2B1; again, by inspection, note that A2 is greater than B1.

The output is (2) +VCN when A=B. The output is sourced to +VCN by 414-413-412-411 when A=2 and B=2. 413-412 is on when A=2, and 414-411 is on when B=2; therefore, the output equals 2 when both A and B equal 2. The output is also sourced to +VCN by 416-415 when A=0 and B=0. 415 is on when A=0, and 416 is on when B=0; therefore, the output equals 2 when both A and B equal 0; therefore, the output equals 2 when both A and B equal 0. Also, the output is sourced to +VCN by 418-417 when A=1 and B=1. 417 is on when A equals 1, and 418 is on when B=1; therefore, the output equals 2 when both A and B equal 1. When the inputs are equal (A0B0, A1B1, or A2B2), the output is 2.

Referring to FIG. 10, the check trit comparator unit 400 is comprised of four individual trinary logic comparators 431-434. Each comparator receives two check trits with the first one being on the CT1 line from CTG-1 via register 5 and the second one being on the CT2 line from CTG-2. Each of the comparators 431-434 operates individually as described for FIG. 10A to produce four syndrome trits on SY-1 to SY-4, respectively. These are transferred to both the Single Error Detector 600 (SED) and also the Multiple Error Detector 700 (MED).

Single Error Detector

Referring to FIG. 11, the single error detector unit 600 monitors the four Syndrome trits (SY1-SY4) to detect a discrete single data trit error. The nine output select trits (S0-S8) are used by the data corrector 500 to select either an incremented, decremented, or as-is trit from register 3 to provide error-free data trits on the output of the trinary error correction code system. Only one of the select lines become active as a 0 or 1 when a single trit error is encountered; the other eight select lines will be trinary 2, indicating that the associated data trit has no error.

Referring to FIG. 11A, single error detector circuit trit 0 is an expanded schematic of circuit 610 in single error detector 600. Circuits 611, 612, 613 in the single error detector circuit trit 0 are expanded schematics of circuits 611, 612, and 613 in the single error detector 600.

Four syndrome trits are monitored to determine if and what type of trinary error exists on the nine data trits (D0-D8). The nine select outputs (S0-S8) each indicate one of the following conditions on its associated trinary data trit: trinary 1 indicates that the input data trit has been incremented, trinary 0 indicates that the input data trit has been decremented, and trinary 2 indicates that no error exists on that data trit.

Note in the table in FIG. 23 that data trit 0 has x's on the check trits 1 and 2 lines, indicating that they are used in checking data trit 0. If data trit 0 has been incremented, SY1 and SY2 will be trinary 11. Note also that data trit 3 has SY1 and SY2 selected with x's. To prevent an error on data trit 3 from indicating an error in both trit 3 and 0, check trit 3 must also be monitored for trinary 2. Similarly, a data trit 6 error would also flag data trit 0 in error if check trit 4 was not monitored for trinary 2. Thus, an incrementation error on data trit 0 is indicated by SY1-SY4 being only 1122, at which time the four sensors in circuit 611 are active sourcing the output to VDD for a trinary 1. A decrementation error on data trit 0 is indicated by SY1-SY4 being only 0022, at which time the four sensors in circuit 613 are active sinking the output to ground for a trinary 0. A no-error condition is indicated by SY1-SY4 being 2222, at which time the four sensors in circuit 612 are active sourcing the output to VCN for a trinary 2.

A syndrome (SY1-SY4) input of 1122 activates circuit 611, and the select trit S0 is sourced to VDD to indicate that data trit 0 has been incremented.

A syndrome (SY1-SY4) input of 2222 activates circuit 612, and the select trit S0 is sourced to VCN to indicate that data trit 0 has no error.

A syndrome (SY1-SY4) input of 0022 activates circuit 613, and the select trit S0 is sinked to GND to indicate that data trit 0 has been decremented.

A syndrome (SY1--SY4) input of 1212 activates circuit 621, and the select trit S1 is sourced to VDD to indicate that data trit 1 has been incremented.

A syndrome (SY1-SY4) input of 2222 activates circuit 622, and the select trit S1 is sourced to VCN to indicate that data trit 1 has no error.

A syndrome (SY1-SY4) input of 0202 activates circuit 623, and the select trit S1 is sinked to GND to indicate that data trit 1 has been decremented.

A syndrome (SY1-SY4) input of 2112 activates circuit 631, and the select trit S2 is sourced to VDD to indicate that data trit 2 has been incremented.

A syndrome (SY1-SY4) input of 2222 activates circuit 632, and the select trit S2 is sourced to VCN to indicate that data trit 2 has no error.

A syndrome (SY1-SY4) input of 2002 activates circuit 633, and the select trit S2 is sinked to GND to indicate that data trit 2 has been decremented.

A syndrome (SY1-SY4) input of 1112 activates circuit 641, and the select trit S3 is sourced to VDD to indicate that data trit 3 has been incremented.

A syndrome (SY1-SY4) input of 2222 activates circuit 642, and the select trit S3 is sourced to VCN to indicate that data trit 3 has no error.

A syndrome (SY1-SY4) input of 0002 activates circuit 643, and the select trit S3 is sinked to GND to indicate that data trit 3 has been decremented.

A syndrome (SY1-SY4) input of 1221 activates circuit 651, and the select trit S4 is sourced to VDD to indicate that data trit 4 has been incremented.

A syndrome (SY1-SY4) input of 2222 activates circuit 652, and the select trit S4 is sourced to VCN to indicate that data trit 4 has no error.

A syndrome (SY1-SY4) input of 0220 activates circuit 653, and the select trit S4 is sinked to GND to indicate that data trit 4 has been decremented.

A syndrome (SY1-SY4) input of 2121 activates circuit 661, and the select trit S5 is sourced to VDD to indicate that data trit 5 has been incremented.

A syndrome (SY1-SY4) input of 2222 activates circuit 662, and the select trit S5 is sourced to VCN to indicate that data trit 5 has no error.

A syndrome (SY1-SY4) input of 2020 activates circuit 663, and the select trit S5 is sinked to GND to indicate that data trit 5 has been decremented.

A syndrome (SY1-SY4) input of 1121 activates circuit 671, and the select trit S6 is sourced to VDD to indicate that data trit 6 has been incremented.

A syndrome (SY1-SY4) input of 2222 activates circuit 672, and the select trit S6 is sourced to VCN to indicate that data trit 6 has no error.

A syndrome (SY1-SY4) input of 0020 activates circuit 673, and the select trit S6 is sinked to GND to indicate that data trit 6 has been decremented.

A syndrome (SY1-SY4) input of 2211 activates circuit 681, and the select trit S7 is sourced to VDD to indicate that data trit 7 has been incremented.

A syndrome (SY1-SY4) input of 2222 activates circuit 682, and the select trit S7 is sourced to VCN to indicate that data trit 7 has no error.

A syndrome (SY1-SY4) input of 2200 activates circuit 683, and the select trit S7 is sinked to GND to indicate that data trit 7 has been decremented.

A syndrome (SY1-SY4) input of 1211 activates circuit 691, and the select trit S8 is sourced to VDD to indicate that data trit 8 has been incremented.

A syndrome (SY1-SY4) input of 2222 activates circuit 692, and the select trit S8 is sourced to VCN to indicate that data trit 8 has no error.

A syndrome (SY1-SY4) input of 0200 activates circuit 693, and the select trit S8 is sinked to GND to indicate that data trit 8 has been decremented.

When a single trit is flagged as having an error, the syndrome trits are not all 2222; thus, the other eight trits' single error detectors do not receive a no-error indication on the syndrome trits. If the syndrome trits are 1211 indicating that data trit 8 was incremented, detectors 612, 622, 632, 642, 652, 662, 672 and 682 do not receive 2222, preventing the S0-S8 outputs from being sourced to VCN for trinary 2's. Addition of the pull-up resistors on the outputs performs the function of pulling the outputs to VCN any time that none of the active circuits, i.e., 611, 612, and 613 for trit 0, are selected.

Normally, the syndrome trits will be 2222 indicating no-error with active pull-up to VCN for all nine trits. Only when an error is encountered will the pull-up resistors become effective for the select lines without the error.

Referring to FIG. 11B, single error OR circuit 650 performs an OR function on the nine selection lines (S0-S8) to provide a single line which indicates single error. The circuits 614-694 monitor for a level NOT2 (a "1" or "0") on the select lines; if any one of the nine lines is at level 1 or 0, the output goes to level 1, indicating a single trit error. When all of the select lines are level 2, the output goes to level 0, indicating NOT a single error.

No Error Detector

Figure 12:
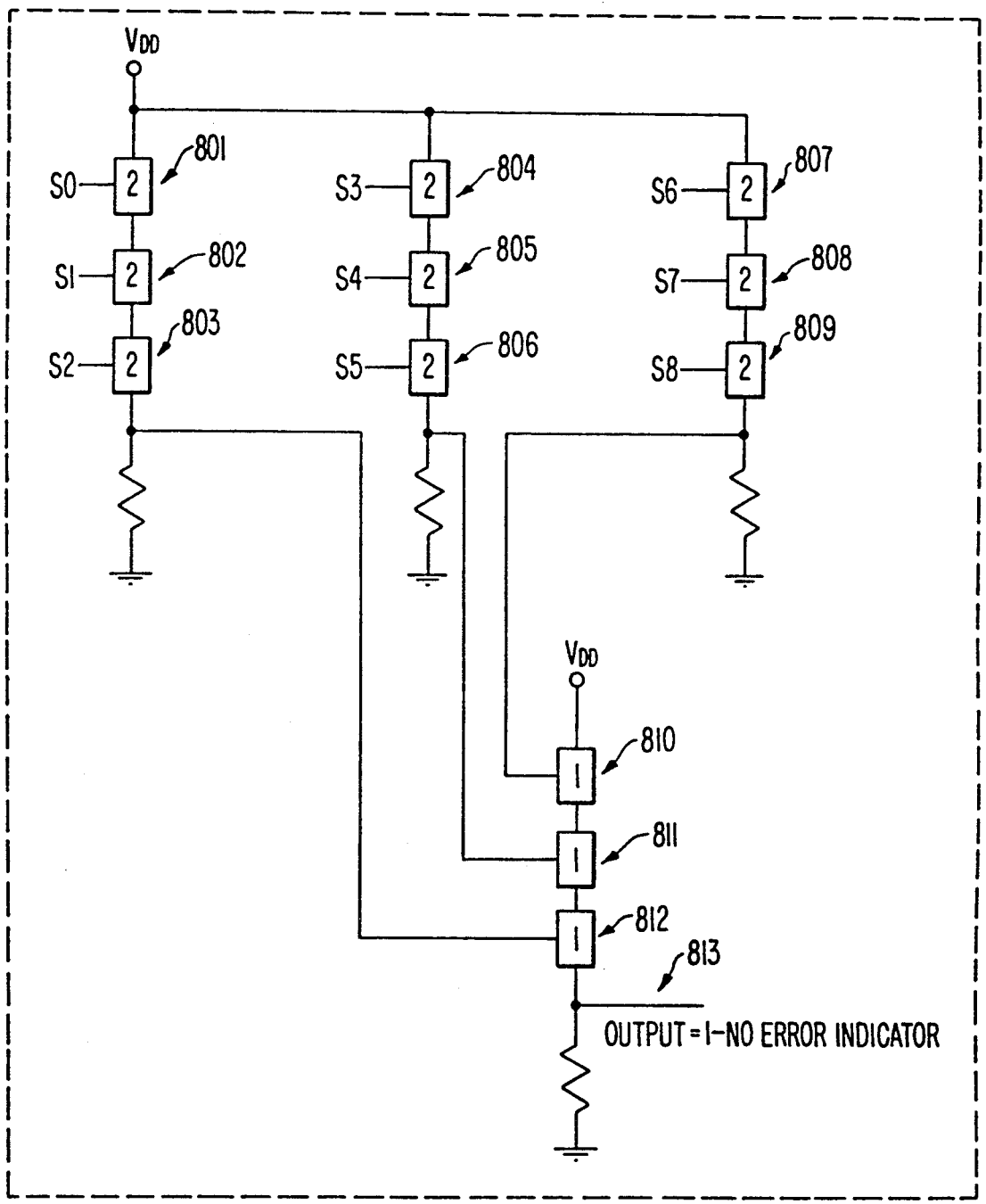
FIG. 12 is a schematic logic diagram for the no-error detector (NED).

Referring to FIG. 12, the NED (800) receives the nine select lines (S0-S8) from the SED 600. The no-error detector performs an AND function on the nine select lines (S0-S8) to provide a single line which indicates no error. The circuits 801-812 monitor for a level 2 (not 1 and not 0) on the select lines. When all nine select lines are level 2 (no error), the output goes to level 1 to indicate no-error condition on the entire data tryte. If any one of the nine select lines is at level 1 or 0 (an incremented error or a decremented error, respectively), the output goes to level 0, indicating that the data tryte has an error.

Select lines S0, S1, and S2 are ANDed together in circuits 801, 802, and 803; select lines S3, S4, and S5 are ANDed together in circuits 804, 805, and 806; and select lines S6, S7, and S8 are ANDed together in circuits 807, 808, and 809. The three ANDed signals are then ANDed together in circuit 810, 811, and 812 to provide an output line 813 indicating no-error.

A level 2 on S0 into circuit 801 gates that circuit on.
A level 2 on S1 into circuit 802 gates that circuit on.
A level 2 on S2 into circuit 803 gates that circuit on.
When all three circuits 801, 802, and 803 are on, the output which goes to circuit 812 is at level 1.
A level 2 on S3 into circuit 804 gates that circuit on.
A level 2 on S4 into circuit 805 gates that circuit on.
A level 2 on S5 into circuit 806 gates that circuit on.
When all three circuits 804, 805, and 806 are on, the output which goes to circuit 810 is at level 1.
A level 2 on S6 into circuit 807 gates that circuit on.
A level 2 on S7 into circuit 808 gates that circuit on.
A level 2 on S8 into circuit 809 gates that circuit on.
When all three circuits 807, 808, and 809 are on, the output which goes to circuit 810 is at level 1.

When all three inputs to circuits 810, 811, and 812 are at level 1, all three circuits are gated on, thus, the output 813 is sourced to VDD (level 1) indicating no-error condition.

A level 1 on S0 into circuit 801 degates that circuit off.
A level 0 to S0 into circuit 801 degates that circuit off.
A level 1 to S1 into circuit 802 degates that circuit off.
A level 0 to S1 into circuit 802 degates that circuit off.
A level 1 to S2 into circuit 803 degates that circuit off.
A level 0 to S2 into circuit 803 degates that circuit off.
When any one circuit 801, 802, or 803 is off, the output which goes to circuit 812 is at level 0.
A level 1 on S3 into circuit 804 degates that circuit off.
A level 0 to S3 into circuit 804 degates that circuit off.
A level 1 on S4 into circuit 805 degates that circuit off.
A level 0 to S4 into circuit 805 degates that circuit off.
A level 1 on S5 into circuit 806 degates that circuit off.
A level 0 to S5 into circuit 806 degates that circuit off.
When any one circuit 804, 805, or 806 is off, the output which goes to circuit 811 is at level 0.
A level 1 on S6 into circuit 807 degates that circuit off.
A level 0 to S6 into circuit 807 degates that circuit off.
A level 1 on S7 into circuit 808 degates that circuit off.
A level 0 to S7 into circuit 808 degates that circuit off.
A level 1 on S8 into circuit 809 degates that circuit off.
A level 0 to S8 into circuit 809 degates that circuit off.
When any one circuit 807, 808, or 809 is off, the output which goes to circuit 810 is at level 0.

When any one of the three inputs to circuits 810, 811, and 812 are at level 0, the circuit which that signal drives is degated.

This breaks the series path to VDD (level 1) and inhibits the output from being sourced to VDD; thus, the output 813 is pulled to ground (level 0) indicating an error condition.

When all nine inputs are at level 2, the output 813 is at level 1 indicating no-error. When any one of the nine inputs goes to either level 1 or 0, the overall AND function is broken, and the output 813 goes to ground (level 0) indicating that one of the data trits has an error.

Multiple Error Detector 700

Figure 13:
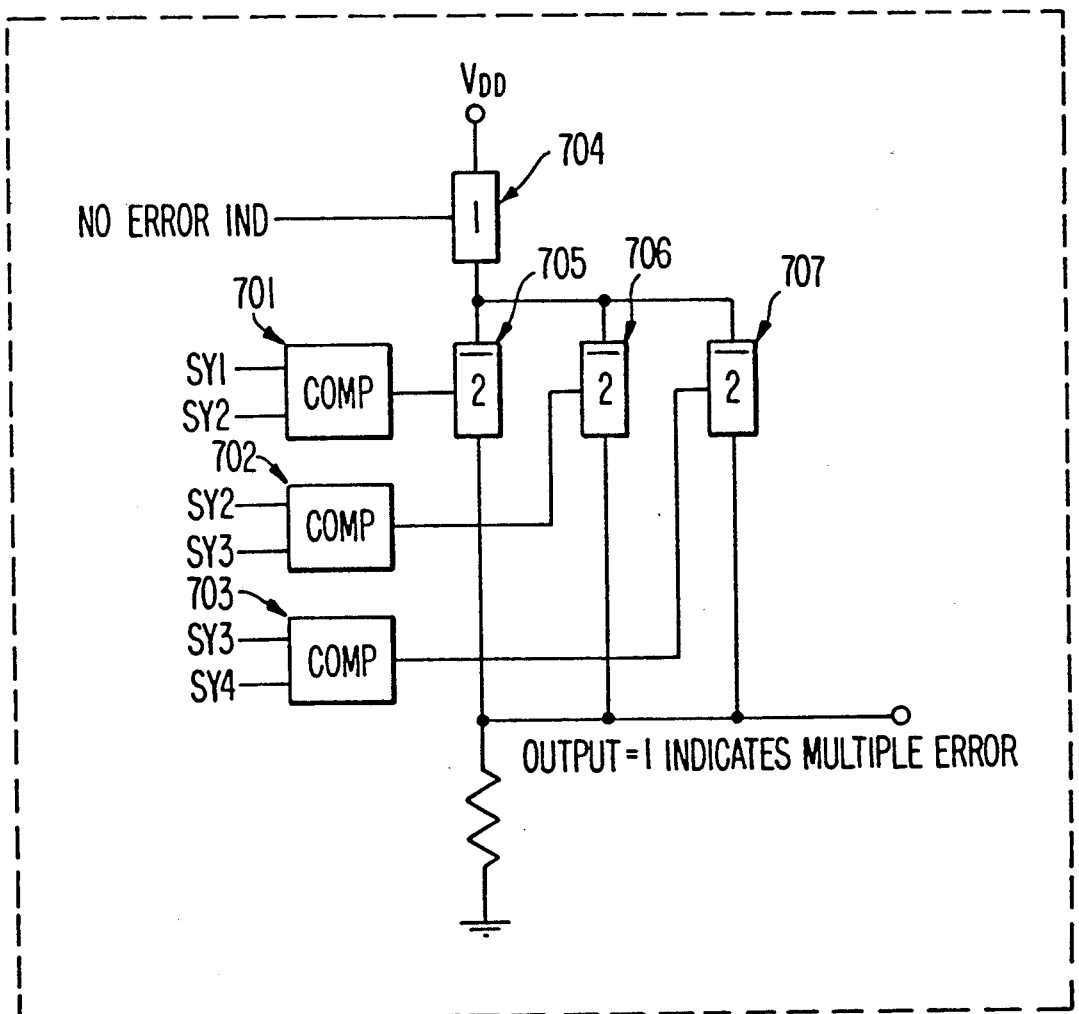
FIG. 13 is a logic diagram of the multiple error detector (MED).

Referring to FIG. 13, the multiple error detection unit 700 monitors the four syndrome trits (SY1-SY4) to detect a multiple data trit error, more than one trit in error. The output of this detector consists of one output which indicates a multiple trit error has been detected when it is at level 1.

Note in FIG. 23 that data trit 0 has x's on check trits 1 and 2 lines, indicating that they are used in checking data trit 0. If data trit 0 has been incremented, SY1 and SY2 will be trinary 11. Note also that data trit 3 has SY1 and SY2 selected with x's. To prevent an error on data trit 3 from indicating an error in both trit 3 and 0, check trit 3 must also be monitored for trinary 2. Similarly, a data trit 6 error would also flag data trit 0 in error if check trit 4 was not monitored for trinary 2.

Note the four-trit codes in the single error detector 600 which indicate a single trit error. When a code which does not match any of these single error indicating codes, the select lines (S0-S8) will all be pulled up to level 2. By not being level 0 or 1, the select lines indicate that a single trit error does not exist—it is not saying that a multiple trit error does not exist. More checking is needed to sense a multiple trit error.

The no-error indicator input to circuit 704 of the multiple error detector 700 comes from the no-error detector 800. Circuit 704 is gated on when the no-error indicator is level 1 as noted inside circuit 704. Circuit 704 is in series (AND) with the paralleled circuits 705, 706, and 707 (OR). The no-error indicator from 800 is level 1 when all select lines (S0-S8) are level 2. This will occur when a multiple trit error exists.

An incrementation error on data trit 0 is indicated by SY1-SY4 being only 1122, at which time the four sensors in circuit 611 are active sourcing the output to VDD for a trinary 1. A decrementation error on data trit 0 is indicated by SY1-SY4 being only 0022, at which time the four sensors in circuit 613 are active sinking the output to ground for a trinary 0. A no-error condition is indicated by SY1-SY4 being 2222, at which time the four sensors in circuit 612 are active sourcing the output to VCN for a trinary 2.

The multiple error detector monitors the positions in FIG. 23 which do NOT have an x. The empty positions must be trinary 2 on the associated check trit.

The multiple error detector consists of circuits 701-707. The comparators (701, 702, and 703), are trinary comparators. The comparator's output is at one of three trinary levels. Either a trinary 1 or 0 indicates a miscompare on the two inputs. A level 1 on the output of 701 indicates that SY1 is greater than SY2. A level 0 on the output of 701 indicates that SY1 is less than SY2. A trinary 2 indicates a compare of the two inputs. A level 2 on the output of 701 indicates that SY1 is equal to SY2.

When a no-error condition exists, all four Syndrome trits (SY1-SY4) are at level 2. Also, the no-error indicator from the no-error detector 800 will be at level 1 (no error) because of the following: all four syndrome trits (SY1-SY4) being at levels 2222 into the single error detector 600 gates the circuits 612, 622, 632, 642, 652, 662, 672, 682, and 692 ON, generating level 2's on select lines (S0-S8); and the select lines' all being level 2 generates level 1 on the no-error indicator. The no-error indicator gates circuit 704 ON to sample for multiple errors in the multiple error detector 700. With all four syndrome trits (SY1-SY4) are level 2, the outputs from circuits 701, 702, and 703 at level 2 indicating compares on the input syndrome trits. Both level 2's on SY1 and SY2 into circuit 701 generates the compare output level 2. Both level 2's on SY2 and SY3 into circuit 702 generates the compare output level 2. Both level 2's on SY3 and SY4 into circuit 703 generates the compare output level 2. Comparator 701's output being at level 2 degates NOT2 sensor 705. Comparator 702's output being at level 2 degates NOT2 sensor 706. Comparator 703's output being at level 2 degates NOT2 sensor 707. With all three NOT2 sensors being degated, the multi-error output is not sourced to VDD and the output is level 0 indicating that a multi-error does not exist.

When a multiple trit error exists, not all four syndrome trits (SY1-SY4) are at level 2—at least one will be not2. Also, the no-error indicator from the no-error detector 800 will be at level 1 (no error) because of the following: the four syndrome trits' code does not match any of the single error detection codes, and does not match the 2222 code—the select lines are sourced to VCN (level 2) via the resistors; and the select lines' all being level 2 generates level 1 on the no-error indicator. The no-error indicator gates circuit 704 ON to sample for multiple errors in the multiple-error detector 700. With the four syndrome trits (SY1-SY4) not all being level 2's, the outputs from comparators 701, 702, and 703 are not all level 2 indicating a miscompare in at least one of the three comparators. The SY1 and SY2 not being a match into comparator 701 generates the miscompare output level 0. The SY2 and SY3 not being a match into comparator 702 generates the miscompare output level 0. The SY3 and SY4 not being a match into comparator 703 generates the miscompare output level 0. The miscompare level 0 on the output of either of the three comparators 701, 702, or 703 gates ON the NOT2 sensor 705, 706, or 707, respectively. Comparator 701's output being at level NOT2 (1 or 0) gates NOT2 sensor 705. Comparator 702's output being at level NOT2 (1 or 0) gates NOT2 sensor 706. Comparator 703's output being at level NOT2 (1 or 0) gates NOT2 sensor 707. With at least one of the NOT2 sensors being gated, the mult-error output is sourced to VDD through circuit 704, and the output is level 1 indicating that a multi-error does exist.

Error Indicator

Referring to FIG. 17, error indicator 750 generates a single trinary output which indicates the error status of the data tryte. Level 1 indicates single error. Level 2 indicates no error. Level 0 indicates multiple error.

When a single error exists, level 1 on the single error indicator from 650 gates level 1 sensor 751 ON, sourcing the output to VDD for level 1 (single error); also, NOT1 sensor 753 is degated.

When a multiple error exists, level 1 on the multiple error indicator from 700 gates level 1 sensor 752 ON, sinking the output to ground for level 0 (multiple error); also, NOT1 sensor 754 is degated.

When no error exists, level 0 on the single error indicator from 650 degates level 1 sensor 751 OFF, inhibiting sourcing the output to VDD; also, NOT1 sensor 753 is gated ON. Level 0 on the multiple error indicator from 700 degates level 1 sensor 752 OFF, inhibiting sinking the output to VDD; also, NOT1 sensor 754 is gated ON. With both NOT1 sensors 753 and 754 gated ON, the output is sourced to VCN for level 2 (no error).

Data Corrector

Figure 2:
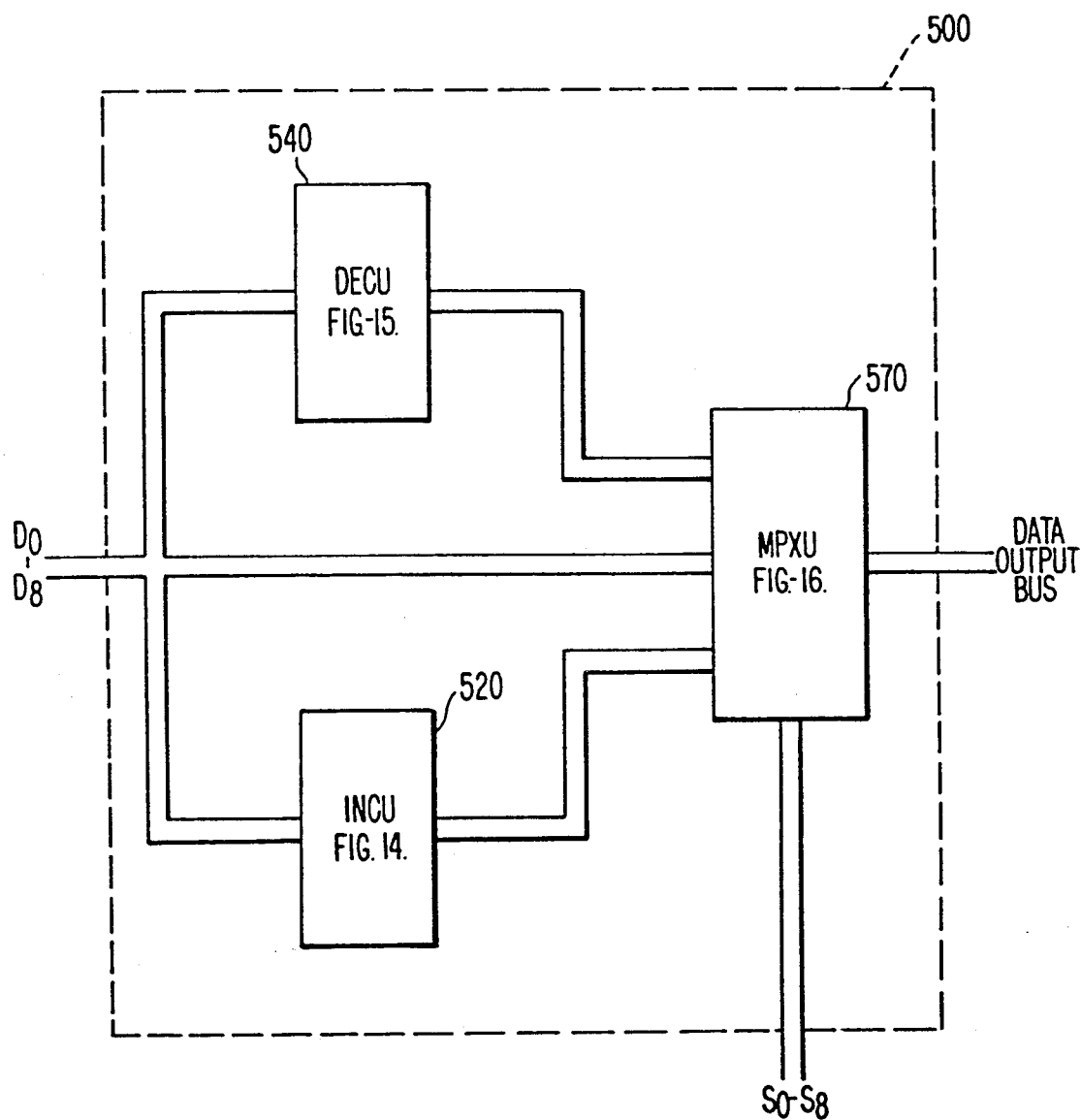
FIG. 2 is a block diagram of the data corrector section of the system.

Referring to FIG. 2, the data corrector includes the multiplexer unit 570, decrementor unit 540 and incrementor unit 520. Under control of the S0-S8 select trit signals from the single error detector, the multiplexer unit selects either the incremented data tryte, the decremented data tryte, or the unaltered data tryte for passage to the output bus.

Trinary Logic Decrementor Unit

The trinary decrementor unit (TDU) 540 shown in FIG. 15 is made up of individual decrementors as shown in detail in FIG. 15A. Referring to FIG. 15A, the decrementor decrements an input by subtracting one from a trinary input underflowing to two when decrementing from zero.

For an input of "0", 551 and 554 are "on" while 552 and 553 are "off". 552 being off blocks VDD from the output line 555 while 553 being off blocks gnd from the output line. 554 being "on" passes VCN (2), thus setting the output line at 2.

For an input of "1", 552 and 553 are "on" while 551 and 554 are "off". 551 being off blocks VDD from the output line while 554 being off blocks VCN from the output. 553 being "on" passes gnd (0) thus setting the output line at 0.

For an input of "2", 551 and 552 are "1" while 553 and 554 are "off". 553 being off blocks and (0) from the output while 554 being off blocks VCN from the output. 551 and 552 being "on" passes VDD (1) thus setting the output line at (1).

The decrementor unit DEC, FIG. 15, which is made up of individual decrementor units 541-549, decrements each of the nine trits on data lines D0-D8 and passes on the decremented output to the multiplexer 570.

Trinary Logic Incrementor Unit

Figure 14:
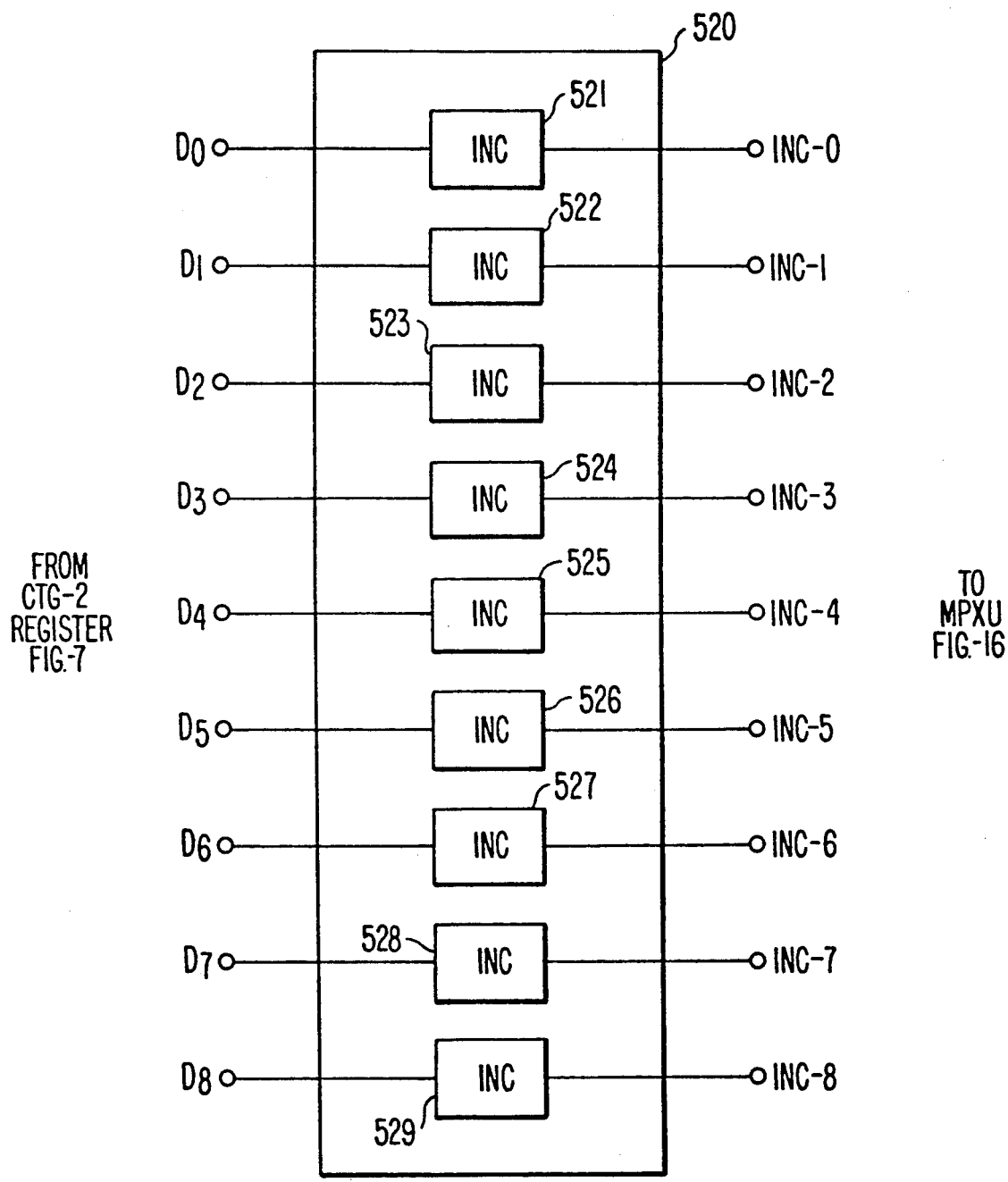
FIG. 14 is a logic diagram of the incrementor unit.
Figures 14A, 14B:
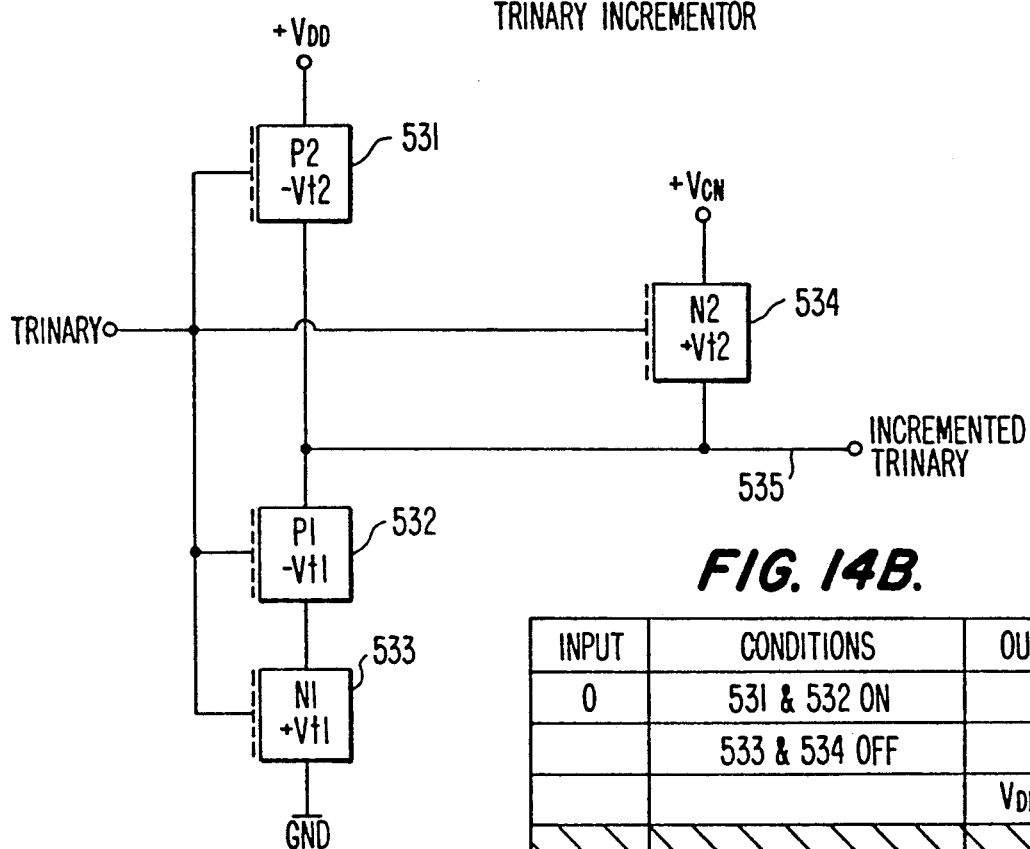
FIG. 14A is a logic diagram of a trinary incrementor.
FIG. 14B is a chart indicating the condition of the incrementor logic devices for the trinary inputs.

The trinary incrementor unit 520 shown in FIG. 2 comprises individual incrementers as shown in detail in FIG. 14A. Referring to FIG. 14A, an incrementor increments an input by adding one to a trinary level input overflowing to zero when incrementing a 2. For a zero (0) input, 531 and 532 are "on" while 533 and 534 are "off". 533 being "off" blocks ground from the output line 535 while 534 being "off" blocks VCN (2) from the output line 535. 531 being "on" allows VDD (trinary logic 1 level) to set the output line 535 at "1".

For a one (1) input 533 and 534 are "on" while 531 and 532 are "off". 531 being "off" blocks VDD from the output line while 532 being off blocks gnd (0) from the output line. 534 being "on" passes VCN (trinary logic level 2) to the output line setting the output at 2.

For a two (2) input 532 and 533 are "on" while 531 and 534 are "off". 531 being off blocks VDD from the output while 534 being off blocks VCN from the output. 532 and 533 being "on" allows gnd to set the output line at 0.

Referring to FIG. 14, the trinary logic incrementor unit (TIU) made up of individual incrementers 521-529 increments each of the nine trits on data lines D0-D8 and passes on the incremented output to multiplexer 570.

Trinary Multiplexor Unit

Figure 16:
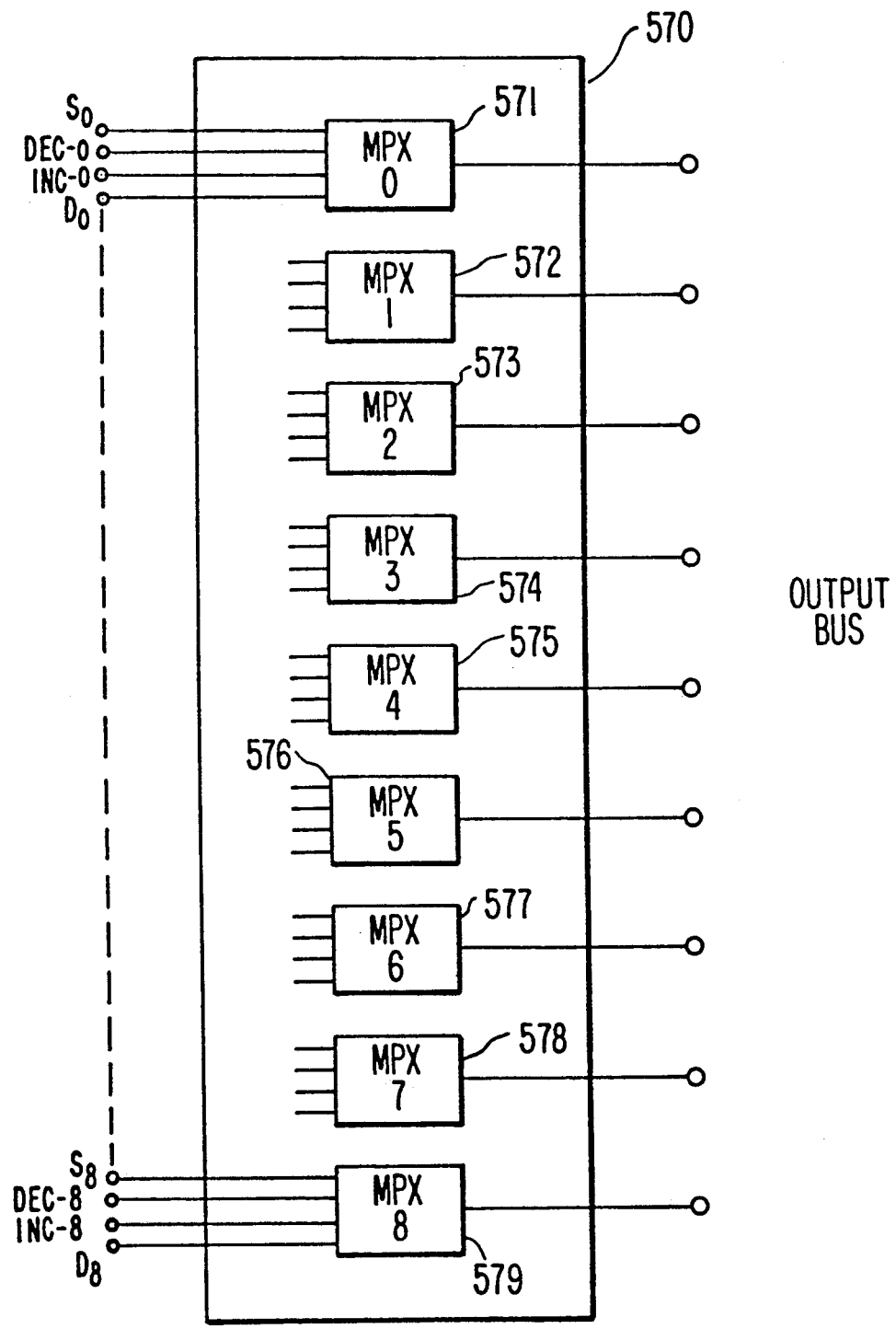
FIG. 16 is the logic diagram of the multiplexor unit (MPXU).

The MPXU (570) of FIG. 16 comprises nine individual multiplexors 571-579 which select one of three input lines for placing that particular trinary level on the output bus. Based on the trinary value on the select line, the multiplexor 570 places the input level from either the read data trit, or the decrementor 540, or the incrementor 520 on the output bus. The select line at logic level 2 indicates a "no error" or equal condition, and therefore the read data line D2 is selected with no correction needed. The select line at logic level 1 indicates that the data has increased by logic level 1 and therefore the decrementor input line 540 on D1 which has been decreased by logic level 1 is selected for output thus performing a data correction. The select line at logic level 0 indicates that the data has decreased by logic level 1, and therefore, the incrementor input from 520 on D0 which has been increased by logic level 1 is selected for output thus performing a data correction.

The trinary select lines function as follows:
1 = selects D1 input from the decrementor 540.
2 = selects D2 input from the unaltered data trit line.
0 = selects D0 input from the incrementor 520.

Figure 16A:
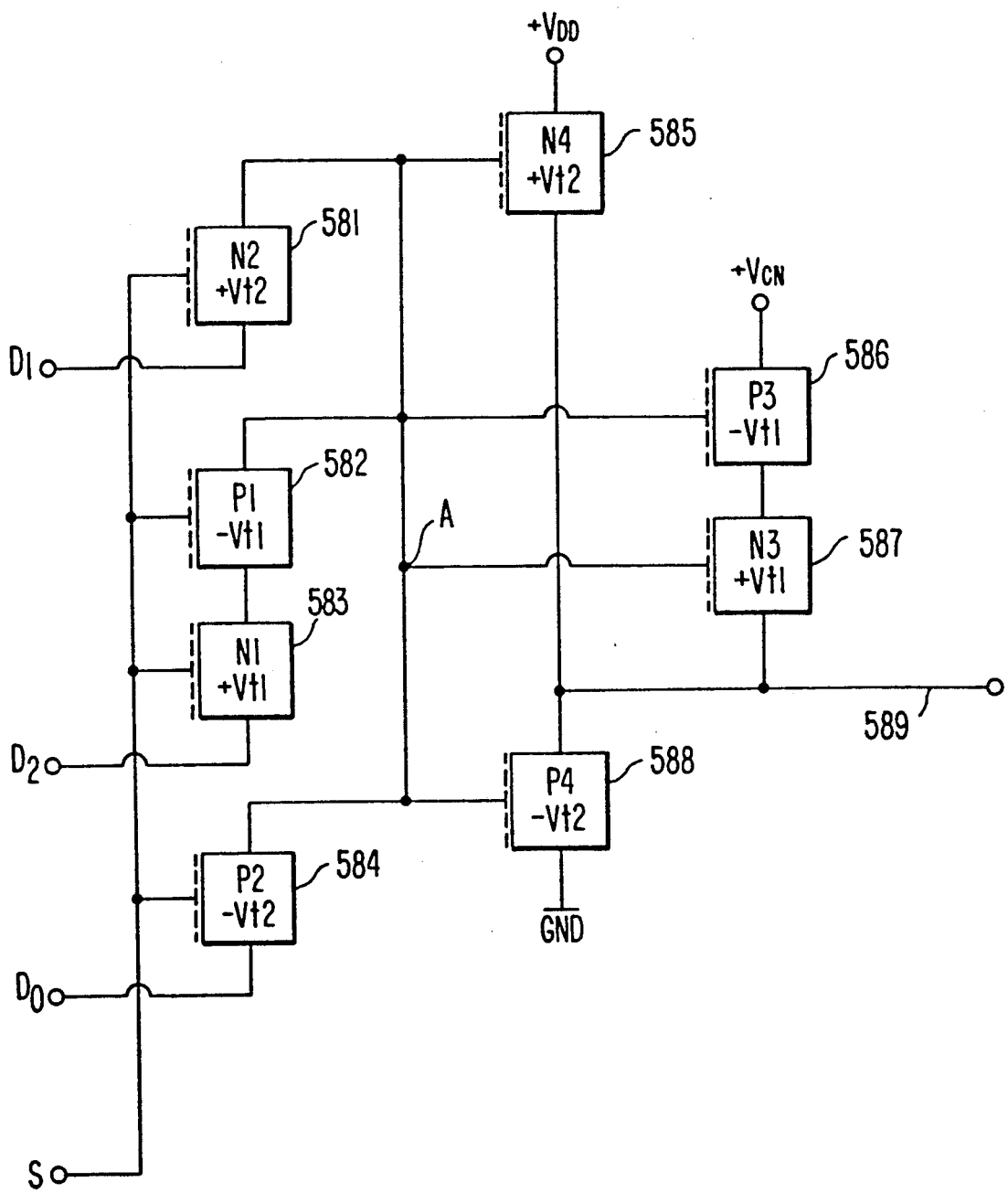
FIG. 16A is a logic diagram of a trinary multiplexor.

Referring to FIG. 16A, the individual multiplexors operate as follows:

When the selection (S) is logic 1, it is above 581's $+Vt2$; therefore, 581 is on, gating D1 data into the multiplexor. The selector's logic 1 is above 584's $-Vt2$, turning it off and inhibiting D0 data input. The S input's logic 1 turns 583 on, but 582 off, inhibiting D2 data input. D1 input is selected by a logic 1 level on the S input. The D1 trinary level at node A controls 585, 588, and 587-586, providing an output at 589 equivalent to the signal at node A. A logic 1 at node A turns on 585, sourcing the output to +VDD, logic 1. A logic 0 at node A turns on 588, sinking the output to ground, logic 0. A logic 2 at node A turns on 587, 586, sourcing the output to +VCN, logic 2.

When the S input is logic 2, 583 is turned on by the logic 2 level being above its $+Vt1$, and 582 is turned on by the logic 2 level being below its $-Vt1$. 581 is inhibited by +VCN, logic 2, level being below 581's $+Vt2$, and 584 is inhibited by the +VCN level being above its $-Vt2$; therefore, a logic 2 on the S input results in the selection of the D2 input. Again, the D2 trinary level at node A controls 585, 588, and 587-586, providing an output at 589 equivalent to the signal at node A. A logic 1 at node A turns on 585, sourcing the output to +VDD, logic 1. A logic 0 at node A turns on 588, sinking the output to ground, logic 0. A logic 2 at node A turns on 587 and 586, sourcing the output to +VCN, logic 2.

When the selector is logic 0 it is below 584's $-Vt2$; therefore, 584 is on, selecting the D0 input. The selector's logic 0 is below 581's $+Vt2$, turning it off and inhibiting data D1 input. The S input's logic 0 turns 582 on, but 583 off, inhibiting the D2 data input. The D0 input is selected by a logic 0 level on the S input. The D0 trinary level at node A controls 585, 588, and 587-586, providing an output at 589 equivalent to the signal at node A. A logic 1 at node A turns on 585, sourcing the output to +VDD, logic 1. A logic 0 at node A turns on 588, sinking the output to ground, logic 0. A logic 2 at node A turns on 587 and 586, sourcing the output to +VCN, logic 2.

Examples of System Operation

The three conditions which can exist for handling data by the trinary error detection and correction system of the invention are no-error, single error, and multiple error. An example of each of these three conditions will be executed through the system.

No-Error

Input data trits D0-D9 from trinary data source (2) 012001122 into check trit generator unit 100 into the CTG-2 register (3).

CTG circuit 101 has 0 and 1 inputs which generates 1 on its output.

CTG circuit 102 has 0 and 0 inputs which generates 0 on its output.

CTG circuit 103 has 1 and 2 inputs which generates 0 on its output.

CTG circuit 104 has 1 and 0 inputs which generates 1 on its output.

CGT circuit 105 has 1 and 0 inputs which generates 1 on CT1-1 (check trit generator number 1, check trit 1).

CTG circuit 111 has 0 and 2 inputs which generates 2 on its output.

CTG circuit 112 has 0 and 1 inputs which generates 1 on its output.

CTG circuit 113 has 2 and 1 inputs which generates 0 on its output.

CTG circuit 114 has 0 and 1 inputs which generates 1 on CT1-2 (check trit generator number 1, check trit 2).

CTG circuit 121 has 1 and 2 inputs which generates 0 on its output.

CTG circuit 122 has 0 and 2 inputs which generates 2 on its output.

CTG circuit 123 has 0 and 2 inputs which generates 2 on its output.

CTG circuit 124 has 2 and 2 inputs which generates 1 on CT1-3 (check trit generator number 1, check trit 2).

CTG circuit 131 has 0 and 1 inputs which generates 1 on its output.

CTG circuit 132 has 1 and 2 inputs which generates 0 on its output.

CTG circuit 133 has 1 and 0 inputs which generates 1 on its output.

CTG circuit 134 has 1 and 2 inputs which generates 0 on CT1-3 (check trit generator number 1, check trit 4).

Input data trits D0-D9 =012001122 into check trit generator unit 200 from, CTG=2 register (3).

CTG circuit 201 has 0 and 1 inputs which generates 1 on its output.

CTG circuit 202 has 0 and 0 inputs which generates 0 on its output

CTG circuit 203 has 1 and 2 inputs which generates 0 on its output.

CTG circuit 204 has 1 and 0 inputs which generates 1 on its output.

CGT circuit 205 has 1 and 0 inputs which generates 1 on CT2-1 (check trit generator number 2, check trit 1).

CTG circuit 211 has 0 and 2 inputs which generates 2 on its output.

CTG circuit 212 has 0 and 1 inputs which generates 1 on its output.

CTG circuit 213 has 2 and 1 inputs which generates 0 on its output.

CTG circuit 214 has 0 and 1 inputs which generates 1 on CT2-2 (check trit generator number 2, check trit 2).

CTG circuit 221 has 1 and 2 inputs which generates 0 on its output.

CTG circuit 222 has 0 and 2 inputs which generates 2 on its output.

CTG circuit 223 has 0 and 2 inputs which generates 2 on its output.

CTG circuit 224 has 2 and 2 inputs which generates 1 on CT2-3 (check trit generator number 2, check trit 3).

CTG circuit 231 has 0 and 1 inputs which generates 1 on its output.

CTG circuit 232 has 1 and 2 inputs which generates 0 on its output.

CTG circuit 233 has 1 and 0 inputs which generates 1 on its output.

CTG circuit 234 has 1 and 2 inputs which generates 0 on CT2-4 (check trit generator number 2, check trit 4).

The check trit comparator 400 compares the outputs of the check trit generator number 1 with the outputs of check trit generator number 2 to generate the syndrome trits (SY1-SY4).

Comparator circuit 431 has 1 and 1 inputs which generates 2 indicating compare.

Comparator circuit 432 has 1 and 1 inputs which generates 2 indicating compare.

Comparator circuit 433 has 1 and 1 inputs which generates 2 indicating compare.

Comparator circuit 434 has 0 and 0 inputs which generates 2 indicating compare.

SY1-SY4 are 2222.

The single error detector 600 monitors the syndrome trits SY1-SY4 which are 2222. AND circuits 612, 622, 632, 642, 652, 662, 672, 682, and 692 are all active sourcing the select trits S0-S8 to VCN for level 2 indicating that every data trit is correct and no error correction is needed. The select trits are 222222222.

The S0-S8 select trit lines being all 2's to the multiplexor unit 570 activate the multiplexors 571-579 to gate the D0-D8 data lines through to the data output bus in the uncorrected or original condition.

The single error detector circuit trit 0 is an expanded circuit of the trit 0 on the single error detector 600. SY1-SY4 are 2222 on the inputs.

AND circuit 611 has the top two level 1 sensors turned OFF, and the bottom two are ON.

The series string is broken by either of the top two being OFF, and circuit 611 does not source the output to VDD level 1.

AND circuit 613 has the top two level 0 sensors turned OFF, and the bottom two are ON.

The series string is broken by either of the top two being OFF, and circuit 613 does not sink the output to Gnd level 0.

AND circuit 612 has all four level 1 sensors turned ON.

The series string is connected from VCN to the output, and AND circuit 612 does source the output to VCN level 2, indicating that data trit 0 has no error.

The single error OR circuit 650 OR's the select trits S0-S8 to check for the presence of any data trits needing to be corrected. With 222222222 input, all of the NOT2 sensors are OFF, and the output is not sourced to VDD—the output is level 0, indicating that no single trit error exists.

The no-error detector 800 performs an AND function on the nine select trits S0-S8. All nine of the level 2 sensors, circuits 801-809 are ON with 222222222 input. The trinary signals on the outputs of 803, 806, and 809 are 111, which are ANDed in 810, 811, and 812 sourcing the output 813 to VDD level 1. Trinary logic level 1 on the no error indicator signals that no single trit error exists.

The multiple error detector 700 checks the syndrome trits SY1-SY4 for inconsistency among the four syndrome trits. The no error indicator could be all 2's because of a multiple trit error, being pulled to VCN by the resistors in the single error detector when no syndrome code matches any of the codes for single trit errors.

The no error indicator is 1 in this case of multiple error; the no error indicator indicates that there are no single trit errors. The three "not 2" sensors, 705, 706, and 707, need only one of them to be active to complete the path for sourcing the output to VDD for level 1, indicating that a multiple error exists. All three of the "not 2" sensors must be OFF to not indicate multiple trit error, as is the case in this example of no errors.

Comparator 701 has inputs 22; the output is 2 and "not 2" sensor 705 is OFF.

Comparator 702 has inputs 22; the output is 2 and "not 2" sensor 706 is OFF.

Comparator 703 has inputs 22; the output is "2, and "not 238 sensor 707 is OFF.

With all three "not 2" sensors off, the sourcing path is incomplete, and the output is level 0, indicating that no multiple error exists.

The error indicator 750 generates the error indicator. The single error indicator from 650 is level 0, turning OFF the "1" sensor 751 and turning ON the "not 1" sensor 753. The multiple error indicator from 700 is level 0, turning OFF the "1" sensor 752 and turning ON the "not 1" sensor 754. Circuits 753 and 754 being ON completes the sourcing path to VCN, and the output is trinary logic level 2, which indicates that no error exists.

Single Error

For the single error example the trit on the D0 line of the tryte has been assumed to have incremented from 0 to 1 in the transfer of the tryte through the CTG-2 register. The tryte was read into the register as [0]12001122 and read out as [1]12001122. Therefore the check trits generated by CTGU-1 will differ from CTGU-2.

CTG circuit 101 has 0 and 1 inputs which generates 1 on its output.

CTG circuit 102 has 0 and 0 inputs which generates 0 on its output.

CTG circuit 103 has 1 and 2 inputs which generates 0 on its output.

CTG circuit 104 has 1 and 0 inputs which generates 1 on its output.

CGT circuit 105 has 1 and 0 inputs which generates 1 on CT1-1 (check trit generator number 1, check trit 1).

CTG circuit 111 has 0 and 2 inputs which generates 2 on its output.

CTG circuit 112 has 0 and 1 inputs which generates 1 on its output.

CTG circuit 113 has 2 and 1 inputs which generates 0 on its output.

CTG circuit 114 has 0 and 1 inputs which generates 1 on CT1-2 (check trit generator number 1, check trit 2).

CTG circuit 121 has 1 and 2 inputs which generates 0 on its output.

CTG circuit 122 has 0 and 2 inputs which generates 2 on its output.

CTG circuit 123 has 0 and 2 inputs which generates 2 on its output.

CTG circuit 124 has 2 and 2 inputs which generates 1 on CT1-3 (check trit generator number 1 check trit 2).

CTG circuit 131 has 0 and 1 inputs which generates 1 on its output.

CTG circuit 132 has 1 and 2 inputs which generates 0 on its output.

CTG circuit 133 has 1 and 0 inputs which generates 1 on its output.

CTG circuit 134 has 1 and 2 inputs which generates 0 on CT1-3 (check trit generator number 1, check trit 4).

Input data trits D0-D9=112001122 into check trit generator unit 200 from CTG-2 register (3).

CTG circuit 201 has 1 and 1 inputs which generates 2 on its output.

CTG circuit 202 has 0 and 0 inputs which generates 0 on its output.

CTG circuit 203 has 1 and 2 inputs which generates 0 on its output.

CTG circuit 204 has 2 and 0 inputs which generates 2 on its output.

CGT circuit 205 has 2 and 0 inputs which generates 2 on CT2-1 (check trit generator number 2, check trit 1).

CTG circuit 211 has 1 and 2 inputs which generates 0 on its output.

CTG circuit 212 has 0 and 1 inputs which generates 1 on its output.

CTG circuit 213 has 0 and 1 inputs which generates 1 on its output.

CTG circuit 214 has 1 and 1 inputs which generates 2 on CT2-2 (check trit generator number 2, check trit 2).

CTG circuit 221 has 1 and 2 inputs which generates 0 on

CTG circuit 222 has 0 and 2 inputs which generates 2 on its output.

CTG circuit 223 has 0 and 2 inputs which generates 2 on its output.

CTG circuit 224 has 2 and 2 inputs which generates 1 on CT2-3 (check trit generator number 2, check trit 3)

CTG circuit 231 has 0 and 1 inputs which generates 1 on its output.

CTG circuit 232 has 1 and 2 inputs which generates 0 on its output.

CTG circuit 233 has 1 and 0 inputs which generates 1 on its output.

CTG circuit 234 has 1 and 2 inputs which generates 0 on (check trit generator number 2, check trit 4).

The check trit comparator unit 400 compares the outputs of the check trit generator number 1 with the outputs of check trit generator number 2 to generate the syndrome trits (SY1-SY4).

Comparator circuit 431 has 1 and 2 inputs which generates 1 indicating no compare.

Comparator circuit 432 has 1 and 2 inputs which generates 1 indicating no compare.

Comparator circuit 433 has 1 and 1 inputs which generates 2 indicating compare.

Comparator circuit 434 has 0 and 0 inputs which generates 2 indicating compare. SY1-SY4 are 1122.

The single error detector 600 monitors the syndrome trits SY1-SY4 which are 1122. AND circuit 611 is the only active sensor in the single error detector, sourcing the select trit 0 (S0) to VDD for level 1 indicating that data trit 0 has been incremented and needs to be decremented to correct the error, S1-S8 are all pulled up to VCN by the resistors for level 2 indicating that no error exists on data trits D1-D8. The select trits are 122222222.

The S0 select trit line being "1" to the multiplexor unit 571 gates the decrement input DEC-0 through to the data output bus. The DEC-0 input is the input on line D0 from CTG-2 register (3) decremented by 1. Since the output on D0 from the CTG-2 register is 1, the decremented trit to multiplexor 571 is "0". Therefore the "0" on the output bus on D0 represents a correction to the first trit position of the tryte. The remaining select trit lines S1-S8 are 2's and will gate the data on lines D1-D8 through multiplexors 572-579 uncorrected.

The single error detector circuit trit 0 is an expanded circuit of the trit 0 on the single error detector 600. SY1-SY4 are 1122 on the inputs.

AND circuit 611 has all four sensors turned ON.

The series string is connected from VDD to the output, and circuit 611 sources the output to VDD level 1, indicating that data trit 0 has been incremented.

AND circuit 612 has the top two level 2 sensors turned OFF, and the bottom two are ON.

The series string is broken by either of the top two being OFF, and circuit 612 does not sink the output to VCN level 2.

AND circuit 613 has the top two level 0 sensors turned OFF, and the bottom two are ON.

The series string is broken by either of the top two being OFF, and circuit 613 does not sink the output to Gnd level 0.

The single error OR circuit 650 OR's the select trits S0-S8 to check for the presence of any data trits needing to be corrected. With 122222222 input, "not 2" sensor 614 is ON, and "not 2" sensors 624-694 are OFF. Sensor 614 being ON sources the output to VDD. The output is level 1, indicating that a single trit error exists.

The no-error detector 800 performs an AND function on the nine select trits S0-S8. Level 2 sensor 801 is OFF, and 802-809 are all ON with 122222222 input. The trinary signals on the outputs of 803, 806, and 809 are 011, which are ANDed in 810, 811, and 812-812 is OFF, inhibiting sourcing the output 813 to VDD level 1. The output is level 0, indicating a single trit error condition.

The multiple error detector 700 checks the syndrome trits SY1-SY4 for inconsistency among the four syndrome trits. The no error indicator could be all 2's because of a multiple trit error, being pulled to VCN by the resistors in the single error detector when no syndrome code matches any of the codes for single errors.

The no error indicator is 0 in this case of a single error, and multiple error path to VDD is broken. The output goes to level 0 no matter what the three comparators indicate. The level 0 on mult-error indicates that no multiple trit error exists.

The error indicator 750 generates the error indicator.

The single error indicator from 650 is level 1, turning ON the level 1 sensor 751 and turning OFF the NOT1 sensor 753.

The multiple error indicator from 700 is level 0, turning OFF the level 1 sensor 752 and turning ON the NOT1 sensor 754. Circuit 751 being ON completes the sourcing path to VDD, and the output is trinary logic level 1, which indicates that a single trit error exists.

Multiple Error

For the multiple error example the first two trits on the D0 and D1 line of the tryte from the data source have been assumed to have incremented from 0 to 1 and 1 to 2, respectively, in the transfer of the tryte through the CTG-2 register (3). The tryte was read into the register as [01]2001122 and read out of the register as [12]2001122. Therefore, the check trits generated by the CTGU-1 will differ from the CTGU-2.

Input data trits D0-D9 from trinary data source (2) = 12001122 into check trit generator unit 100 and into the CTG-2 register (3).

CTG circuit 101 has 0 and 1 inputs which generates 1 on its output.

CTG circuit 102 has 0 and 0 inputs which generates 0 on its output.

CTG circuit 103 has 1 and 2 inputs which generates 0 on its output.

CTG circuit 104 has 1 and 0 inputs which generates 1 on its output.

CGT circuit 105 has 1 and 0 inputs which generates 1 on CT1-1 (check trit generator number 1, check trit 1).

CTG circuit 111 has 0 and 2 inputs which generates 2 on its output.

CTG circuit 112 has 0 and 1 inputs which generates 1 on its output.

CTG circuit 113 has 2 and 1 inputs which generates 0 on its output.

CTG circuit 114 has 0 and 1 inputs which generates 1 on CT1-2 (check trit generator number 1, check trit 2).

CTG circuit 121 has 1 and 2 inputs which generates 0 on its output.

CTG circuit 122 has 0 and 2 inputs which generates 2 on its output.

CTG circuit 123 has 0 and 2 inputs which generates 2 on its output.

CTG circuit 124 has 2 and 2 inputs which generates 1 on CT1-3 (check trit generator number 1, check trit 3).

CTG circuit 131 has 0 and 1 inputs which generates 1 on its output.

CTG circuit 132 has 1 and 2 inputs which generates 0 on

CTG circuit 133 has 1 and 0 inputs which generates 1 on its output.

CTG circuit 134 has 1 and 2 inputs which generates 0 on CT1-4 (check trit generator number 1, check trit 4).

Input data trits D0-D9 = 122001122 into check trit generator unit 200 from CTG = 2 register (3). D0 has been incremented from trinary value 0 to value 1, D1 has been incremented from trinary value 1 to value 2.

CTG circuit 201 has 1 and 2 inputs which generates 0 on its output.

CTG circuit 202 has 0 and 0 inputs which generates 0 on its output.

CTG circuit 203 has 1 and 2 inputs which generates 0 on its output.

CTG circuit 204 has 0 and 0 inputs which generates 0 on its output. CGT circuit 205 has 0 and 0 inputs which generates 0 on CT2-1 (check trit generator number 2, check trit 1).

CTG circuit 211 has 1 and 2 inputs which generates 0 on its output.

CTG circuit 212 has 0 and 1 inputs which generates 1 on its output.

CTG circuit 213 has 0 and 1 inputs which generates 1 on its output.

CTG circuit 214 has 1 and 1 inputs which generates 2 on CT2-2 (check trit generator number 2 check trit 2).

CTG circuit 221 has 2 and 2 inputs which generates 1 on its output.

CTG circuit 222 has 0 and 2 inputs which generates 2 on its output.

CTG circuit 223 has 1 and 2 inputs which generates 0 on its output.

CTG circuit 224 has 0 and 2 inputs which generates 2 on CT2-3 (check trit generator number 2, check trit 3).

CTG circuit 231 has 0 and 1 inputs which generates 1 on its output.

CTG circuit 233 has 1 and 2 inputs which generates 0 on its output.

CTG circuit 233 has 1 and 0 inputs which generates 1 on its output.

CTG circuit 234 has 1 and 2 inputs which generates 0 on CT2-4 (check trit generator number 2, check trit 4).

The check trit comparator 400 compares the outputs of the check trit generator number 1 with the outputs of check trit generator number 2 to generate the syndrome trits (SY1-SY4).

Comparator circuit 431 has 1 and 0 inputs which generates 0 indicating no-compare.

Comparator circuit 432 has 1 and 2 inputs which generates 1 indicating no-compare.

Comparator circuit 433 has 1 and 2 inputs which generates 1 indicating no-compare.

Comparator circuit 434 has 0 and 0 inputs which generates 2 indicating compare.

SY1-SY4 are 0112.

The single error detector 600 monitors the syndrome trits SY1-SY4 which are 0112. No single error sensors are active in the single error detector; neither are any 2222 sensors. All of the select trits S0-S8 are pulled up to VCN by the resistors for level 2 indicating that no single trit error exists on data trits D0-D8. The select trits are 222222222.

The select trit lines S0-S8 being all 2's to multiplexers 571-579 gate the data lines D0-D8 through to the output bus uncorrected functioning identical to the no-error condition since multiple errors cannot be corrected. However, the multiple error indicator from the EI unit 750 can be used to activate the stop or recovery procedures.

The single error detector circuit trit 0 is an expanded of the trit 0 on the single error detector 600. SY1-SY4 are 0112 on the inputs.

Neither AND circuit 611, 612, nor 613 completes a path to any of the three trinary levels.

In circuit 611, only the second and fourth sensors are ON—a 1 input to a 1 sensor, and 2 input into a 2 sensor.

In circuit 612, only the fourth sensor is ON—a 2 input to a 2 sensor.

In circuit 613, only the first and fourth sensors are ON—a 0 input into a 0 sensor and a 2 input to a 2 sensor.

The output is pulled up to VCN by the pull resistor.

The single error OR circuit 650 OR's the select trits S0-S8 to check for the presence of any data trits needing to be corrected. With 222222222 input, all of the NOT2 sensors are OFF, and the output is not sourced to VDD—the output is level 0, indicating that no single trit error exists.

The no error detector 800 performs an AND function on the nine select trits S0-S8. All nine of the level 2 sensors, circuit 801-809 are ON with 222222222 input. The trinary signals on the outputs of 803, 806, and 809 are 111, which are ANDed in 810, 811, and 812 sourcing the output 813 to VDD level 1. Trinary logic level 1 on the no error indicator signals that no single trit error exists.

The multiple error detector 700 checks the syndrome trits SY1-SY4 for inconsistency among the four syndrome trits. The no error indicator could be all 2's because of a multiple trit error, as in this example, being pulled to VCN by the resistors in the single error detector when no syndrome code matches any of the codes for single errors.

The no error indicator is 1 in this case of multiple errors; the no error indicator indicates that there are no single trit errors. The three "not 2" sensors, 705, 706, and 707 need only one of them to be active to complete the path for sourcing the output to VDD for level 1, indicating that a multiple error exists.

Comparator 701 has inputs 01; the output is 0, and "not 2" sensor 705 is ON.

Comparator 702 has inputs 11; the output is 2 and "not 2" sensor 706 is OFF.

Comparator 703 has inputs 12; the output is 0, and "not 2" sensor 707 is ON.

With any one of the three "not 2" sensors ON, the output is sourced to VDD via 704. The output is level 1, indicating that a multiple trit error exists.

The error indicator 750 generates the error indicator. The single error indicator from 650 is level 0, turning OFF the "1" sensor 751 and turning ON the "not 1" sensor 753. The multiple error indicator from 700 is level 1, turning ON the "1" sensor 752 and turning OFF the "not 1" sensor 754. Circuit 752 being ON completes the sinking path to ground, and the output is trinary logic level 10, which indicates that a multiple error condition exists.

Although the description of the error detection and correction system has been described in terms of a trinary (three logic level) operation, the system should not be limited to three logic levels Multiple logic levels of four or more could be used by practicing the principles of the invention herein described for trinary In the multiple logic level system CMOS devices designed to handle four or more voltage switching levels and also extension of the logic units of FIG. 1 to perform multiple logic decisions would be necessary.

In the case of multi-level logic of more than three levels, the trinary "trit" of data would be replaced by a "piece" of data of level 0, or 1, or 2, or—n, and a selected number of pieces of data would comprise a "segment" of data equivalent to the trinary "tryte".

While the invention has been described with respect to particular embodiments above, it would be understood by those skilled in the art that modifications may be made without departing from the spirit and scope of the present invention. These embodiments are for purposes of example and illustration only and are not to be taken to limit the scope of the invention narrower than the scope of the appended claims.

I claim:

1. A trinary check trit generator having multiple logic devices which operate in three logic levels of 0, 1 and 2 herein known as trinary and each piece of information input to said trinary check trit generator is either a 0, or 1, or 2 herein known as a data trit wherein said trinary check trit generator comprises:
   a first voltage level of ground being logic level "0";
   a second voltage level being logic level "1";
   a third voltage level between said first and second voltage levels being logic level "2";
   a first input for receiving a first data trit;
   a second input for receiving a second data trit;
   said multiple logic devices connected to and operated by said first, second, and third voltage levels and also operated by said first and second inputs to develop an output of a particular check trit of logic level 0, or 1, or 2 for each pair of data trits on said first and second inputs.

2. A trinary check trit generator as in claim 1 wherein each of said multiple logic devices are switched to either the "on" or "off" condition by said data trits received at said first and second inputs.

3. A trinary check trit generator which operates in three logic levels comprising:
   a first group of trinary logic devices which operate in the three-logic level mode;
   a first sub-group of trinary logic devices within said first group which is controlled by a first input to open a selected one of multiple paths for one of three s logic levels to pass dependent upon which trinary logic level is applied to said first input;
   a second sub-group of trinary logic devices within said first group which is controlled by a second input to set said multiple paths at one of three logic levels dependent upon which trinary logic level is applied to said second input;
   an output line from said first sub-group which is set at the trinary logic level of the said selected one of multiple paths;
   a second group of trinary logic devices which is controlled by said output line to produce a trinary output of one particular logic level which is established by the trinary logic level combination on said first and second inputs.

4. A trinary check trit generator which operates in three logic levels as in claim 3 wherein said trinary logic devices are multiple threshold MOSFET devices of the N-channel and P-channel types having switching voltages of $+Vt1$, $+Vt2$, $-Vt1$, and $-Vt2$ which operate within parameters including:

trinary logic level zero (0) is ground;
trinary logic level one (1) is VDD;
trinary logic level two (2) is VCN (½VDD);
$+Vt1$ and $+Vt2$ are the switching thresholds of the N-channel MOSFET's reference to ground; $-Vt1$ and $-Vt2$ are the switching thresholds of the P-channel MOSFET's reference to $+VDD$;
a P-channel MOSFET with $-Vt1$ switches at 25% of the way down from $+VDD$ toward ground;
a P-channel MOSFET with $-Vt2$ switches at 75% of the way down from $+VDD$ toward ground;
an N-channel MOSFET with $+Vt2$ switches at 75% of the way up from ground toward $+VDD$; and
an N-channel MOSFET with $+Vt1$ switches at 25% of the way up from ground toward $+VDD$.

5. A trinary check trit generator which operates in three logic levels as in claim 4 wherein said three logic levels are 0, 1, and 2.

6. A trinary check trit generator which operates in three logic levels as in claim 5 wherein said multiple paths consists of three paths.

7. A trinary check trit generator which operates in three logic levels as in claim 6 wherein one of said three paths is connected directly to said first sub-group of trinary logic devices and the remaining two of said three paths pass through logic devices in said second sub-group.

8. A method of generating a trinary check trit of logic level 0, or 1, or 2 for each pair of three-level logic inputs including the steps of:

(1) establishing a first voltage level of ground which will be recognized as trinary logic level (0);
(2) establishing a second voltage level which will be recognized as trinary logic level (1);
(3) establishing a third voltage level of which is one half of said second voltage level and which will be recognized as trinary logic level (2);
(4) applying one of said trinary logic levels to a first input to trinary logic devices of a check trit generator;
(5) having said first input control a first group of said trinary logic devices to open one of a multiple of paths for passage of trinary logic;
(6) opening a particular one of said multiple paths dependent upon which trinary logic level of either 0, 1, 2 is applied to said first input;
(7) applying one of said trinary logic levels to a second input to said trinary logic devices of a said check trit generator;
(8) having said second input control a second group of said trinary logic devices for application of trinary logic to said multiple paths;
(9) passing a selected trinary logic level through said particular one of paths opened by the trinary logic level applied to said first input;
(10) applying the trinary logic level passed through said particular one of said multiple paths to a third group of said trinary logic devices connected to an output line;
(11) placing one of said trinary logic levels of 0, 1, 2 on said output line dependent upon the trinary logic level which has been applied to said third group of trinary logic devices;
(12) whereby said trinary logic level applied to said third group of said trinary logic devices is dependent upon the combination of trinary logic levels applied to said first and second inputs.

9. A method of generating a trinary logic level signal of either 0, 1, or 2 by the steps of:

applying a first trinary logic level signal to a first input;
applying a second trinary logic level signal to a second input;
opening a particular one of three paths by application of said first input;
setting a different trinary logic level of either 0, 1, or 2 on each of said three paths dependent upon the trinary logic level applied to said second input;
applying the trinary logic level on said particular open path to a group of trinary logic devices; and
thereby controlling said group of trinary logic devices to place a particular one of the trinary logic levels on an output connected to said group of trinary logic devices for each set of trinary logic levels applied to said first and second inputs.

10. A trinary latch which operates in the three logic levels of "0", "1" and "2" comprising:

multiple trinary logic switching devices;
a trinary clock input connected to said trinary logic switching device;
a trinary data input connected to said trinary logic switching device;
an output line connected to said trinary logic switching device;
said trinary clock input being at logic level "one" gates said trinary data input into said trinary latch and to said output;
said trinary clock input being at logic level "two" sets the latch condition to retain said trinary data input in said trinary latch and on said output line.

11. A trinary latch as in claim 10 wherein said trinary latch includes a scan data line which reads test data into said trinary latch when said trinary clock input is at logic level "zero".

12. A trinary latch as in claim 11 wherein said multiple trinary logic switching devices are multiple level MOSFET devices.

13. A trinary latch as in claim 11 wherein said multiple trinary logic switching devices includes:

a first group of said devices having their gates connected to said trinary clock input;
a second group of said devices under control of said first group which switch one of the three logic level potentials onto said output line.

14. A trinary latch as in claim 12 wherein said multiple trinary logic switching devices include:

a first N-channel $+Vt2$ device having a gate connected to said trinary clock input, an input connected to said trinary data input and said output connected to a common connection;
a second P-channel $-Vt1$ device having a gate connected to said trinary clock input, an input connected to the output of a third device and an output connected to said common connection;
said third device having a gate connected to said trinary clock input, an input connected to said output and said output connected to the input of said second device;

a fourth N-channel +Vt2 device having a gate connected to said common connection, an input connected to a trinary "one" level potential and an output connected to said output;

a fifth P-channel −Vt2 device having a gate connected to said common connection, an input connected to a trinary "zero" level potential and an output connected to said output line;

a sixth P-channel −Vt1 device having a gate connected to said common connection, an input connected to a trinary "two" level potential and an output connected to said output line;

said seventh N-channel +Vt1 device having a gate connected to said common connection, an input connected to said sixth device output and an output connected to said output line.

15. A trinary latch as in claim 14 wherein said trinary clock input being at level "two" switches the said second and third devices "on" thereby making a conduction path between said output line through said second and third devices to said common connection to set the latch condition.

16. A trinary latch as in claim 14 wherein said multiple trinary logic switching devices include:

an eighth P-channel −Vt2 device having a gate connected to said clock input, an input connected to said scan data line and an output connected to said common connection and switching said eighth device open by said scan data line to receive test data into said trinary latch.

17. A trinary comparator which operates in three level logic of zero, one and two wherein a piece of data in either of the three levels is a-trit, said trinary comparator including:

three level logic (herein called trinary) switching devices which receive and compare a pair of data trits A and B;

said trinary switching devices comparing said A and B trits to generate an output of "one" when A is more than B, and an output of "zero" when A is less than B, and an output of "two" when A equals B 18. A trinary comparator as in claim 17 wherein said trinary logic switching devices are multiple threshold MOSFET devices of the N-channel and P-channel types having switching voltages of +Vt1, +Vt2, −Vt1, and −Vt2 which operate within parameters including:

trinary logic level zero (0) is ground;
trinary logic level one (1) is VDD;
trinary logic level two (2) is VCN (½VDD);
Vt1 and +Vt2 are the switching thresholds of the N-channel MOSFET's reference to ground; −Vt1 and −Vt2 are the switching thresholds of the P-channel MOSFET's reference to +VDD;
a P-channel MOSFET with −Vt1 switches at 25% of the way down from +VDD toward ground;
a P-channel MOSFET with −Vt2 switches at 75% of the way down from +VDD toward ground;
an N-channel MOSFET with +Vt2 switches at 75% of the way up from ground toward +VDD; and
an N-channel MOSFET with +Vt1 switches at 25% of the way up from ground toward +VDD.

19. A trinary comparator as in claim 18 wherein said trinary comparator includes:

a first group of said trinary switching devices referenced to said +VDD potential;

a second group of said trinary switching devices referenced to said ground potential;

a third group of said trinary switching devices referenced to said +VCN potential;

wherein said groups of trinary switching devices cooperate to set said output at the +VDD potential when A is more than B, and set said output at the ground potential when A is less than B, and set said output at the +VCN level when A is equal to B.

20. A trinary multiplexor which operates in three level logic of zero, one and two including:

a piece of data at the logic level of zero, or one, or two being a trit;

first, second and third input lines which carry data trits;

a signal line which carries a control trit;

an output line;

multiple three-level logic switching devices;

said control trit controlling said three-level logic switching devices to set said output line to the logic level of said first input line when said control trit is a "one" and to set said output line to the logic level of said second input lines when said control trit is a "two", and to set said output line to the logic level of said third input line when said control trit is a "zero".

21. A trinary multiplexor as in claim 20 wherein said trinary multiplexor includes:

a first device of the N-channel +Vt1 type;
a second device of the P-channel −Vt1 type;
a third device of the N-channel +Vt1 type;
a fourth device of the P-channel −Vt1 type;
a fifth device of the N-channel +Vt1 type;
a sixth device of the P-channel −Vt1 type;
a seventh device of the P-channel −Vt1 type;
an eighth device of the N-channel −Vt1 type;

said first device having a gate connected to said signal line, an input connected to said first input line, and an Output Connected to a common connection;

said second device having a gate connected to said signal line, an input connected to said third device output and an output connected to said common connection;

said third device having a gate connected to said signal line, an input connected to said second input line and an output connected to said second device input;

said fourth device having a gate connected to said signal line, an input connected to said third input line and an output connected to said common connection;

said fifth device having a gate connected to said common connection, an input connected to the +VDD potential and an output connected to said output line;

said sixth device having a gate connected to said common connection, an input connected to said ground potential and an output connected to said output line;

said seventh device having a gate connected to said common connection, an input connected to said +VCN potential and an output connected to the input of said eighth device; and said eighth device having a gate connected to said common connection, an input connected to the output of said seventh device and an output connected to said output line.

22. A method of generating a multi-level check data signal of n logic levels where n−3 or more for each pair of multi-level logic inputs including the steps of: establishing n voltage levels;

applying one of said n multi-level logic levels to a first input to multi-level logic devices of a check data generator;

opening one of a multiple of paths in said check data generator for passage of n multi-level logic by said first input controlling a first group multi-level logic devices;

selecting a particular one of said multiple paths which will be open by one of n logic levels being applied to said first input;

applying of said n logic levels to a second input to said multi-level logic devices of a check data generator;

controlling a second group of said multi-level logic devices by applying a second input;

passing a selected n logical level through said particular one of said multiple paths opened by the n logic level applied to said first input;

applying the n logic level passed through said particular one of said multiple paths to a third group of said n logic level devices connected to an output line;

placing one of said n logic levels of 0 to n on said output line dependent upon the particular logic level which has been applied to said third group of multi-level logic devices;

whereby the said n logic level applied to said third group of said multi-level logic devices is dependent upon the combination of logic levels applied to said first and second inputs to place a particular data signal of 0-n level on the output for each pair of multi-level input on said first and second inputs.

* * * * *